US012573861B2

(12) United States Patent
Robinson et al.

(10) Patent No.: US 12,573,861 B2
(45) Date of Patent: Mar. 10, 2026

(54) BATTERY ADAPTER FOR POWER TOOLS

(71) Applicant: Kyocera Senco Industrial Tools, Inc., Cincinnati, OH (US)

(72) Inventors: Derick C. Robinson, Hillsboro, OH (US); Anthony D. Kabbes, Cincinnati, OH (US)

(73) Assignee: Kyocera Senco Industrial Tools, Inc., Cincinnati, OH (US)

( * ) Notice: Subject to any disclaimer, the term of this patent is extended or adjusted under 35 U.S.C. 154(b) by 225 days.

(21) Appl. No.: 18/208,363

(22) Filed: Jun. 12, 2023

(65) Prior Publication Data

US 2023/0402857 A1 Dec. 14, 2023

Related U.S. Application Data

(60) Provisional application No. 63/351,865, filed on Jun. 14, 2022.

(51) Int. Cl.
| | |
|---|---|
| *H02J 7/00* | (2006.01) |
| *B25C 1/04* | (2006.01) |
| *B25C 1/06* | (2006.01) |
| *H05K 5/00* | (2025.01) |

(52) U.S. Cl.
CPC ........ *H02J 7/00304* (2020.01); *H02J 7/0042* (2013.01); *H02J 7/0048* (2020.01); *H02J 7/0063* (2013.01); *H05K 5/0086* (2013.01); *B25C 1/047* (2013.01); *B25C 1/06* (2013.01)

(58) Field of Classification Search
CPC .... H02J 7/00304; H02J 7/0042; H02J 7/0048; H02J 7/0063; H05K 5/0086; B25C 1/047; B25C 1/06; B25F 5/00

USPC ......................................................... 361/87
See application file for complete search history.

(56) References Cited

U.S. PATENT DOCUMENTS

| | | | |
|---|---|---|---|
| 6,621,246 | B2 | 9/2003 | Kubale |
| 6,876,173 | B2 | 4/2005 | Mastaler |
| 7,719,234 | B2 | 5/2010 | Carrier |
| 8,237,404 | B2 | 8/2012 | Takano |

(Continued)

FOREIGN PATENT DOCUMENTS

| | | | | |
|---|---|---|---|---|
| CN | 105914549 | A * | 8/2016 | ......... H01R 13/6691 |
| CN | 110829555 | | 2/2020 | |

(Continued)

OTHER PUBLICATIONS

International Search Report, 6 pages, dated Nov. 9, 2023.

*Primary Examiner* — Sreeya Sreevatsa
(74) *Attorney, Agent, or Firm* — Frederick H. Gribbell; Russell F. Gribbell; William E. Crouse

(57) ABSTRACT

A battery adapter can be used with an off-brand battery manufacturer to energize a power tool. The battery adapter is configured to monitor the voltage, temperature, and power level of the battery. Monitoring these levels helps prevent the tool from overdischarging the battery, as well as to prevent overheating. The battery adapter has a visible battery power level indicator, actuated by a switch, which visibly displays to a user a general indication of power left in the battery. The battery adapter is able to electrically disconnect the battery if the monitored temperature reaches a certain threshold. The battery adapter is also able to electrically disconnect if the battery adapter and off-brand battery are connected to a recharge station.

7 Claims, 14 Drawing Sheets

(56)                References Cited

U.S. PATENT DOCUMENTS

| | | | |
|---|---|---|---|
| 8,354,183 B2 | 1/2013 | Konuma | |
| 9,415,499 B2 | 8/2016 | Brotto | |
| 10,027,078 B2 | 7/2018 | Knight | |
| 10,454,264 B2 | 10/2019 | Friedman | |
| 10,559,967 B2 | 2/2020 | Hunger | |
| D887,981 S | 6/2020 | Roberts | |
| 10,807,227 B2 | 10/2020 | Thanner | |
| 10,892,626 B2 | 1/2021 | Rief | |
| 2001/0017531 A1* | 8/2001 | Sakakibara | H02J 7/00047 |
| | | | 320/106 |
| 2006/0197498 A1* | 9/2006 | Bucur | H02J 7/0063 |
| | | | 320/114 |
| 2006/0267548 A1 | 11/2006 | Uehlein-Proctor | |
| 2008/0180059 A1 | 7/2008 | Carrier | |
| 2008/0238370 A1* | 10/2008 | Carrier | H02J 7/0013 |
| | | | 320/136 |
| 2011/0121782 A1* | 5/2011 | Marsh | H02J 7/02 |
| | | | 320/114 |
| 2011/0198103 A1* | 8/2011 | Suzuki | H02J 7/0048 |
| | | | 173/46 |
| 2013/0331994 A1 | 12/2013 | Ng | |
| 2016/0248075 A1 | 8/2016 | Cruise | |
| 2016/0356825 A1* | 12/2016 | Bae | H03F 3/45475 |
| 2018/0366964 A1 | 12/2018 | Mu | |
| 2019/0143495 A1* | 5/2019 | Mergener | B25D 16/006 |
| | | | 318/139 |
| 2019/0143498 A1 | 5/2019 | Mergener | |

FOREIGN PATENT DOCUMENTS

| | | |
|---|---|---|
| KR | 20190030086 | 3/2019 |
| WO | 2014192372 | 12/2014 |
| WO | 2018012795 | 1/2018 |

* cited by examiner

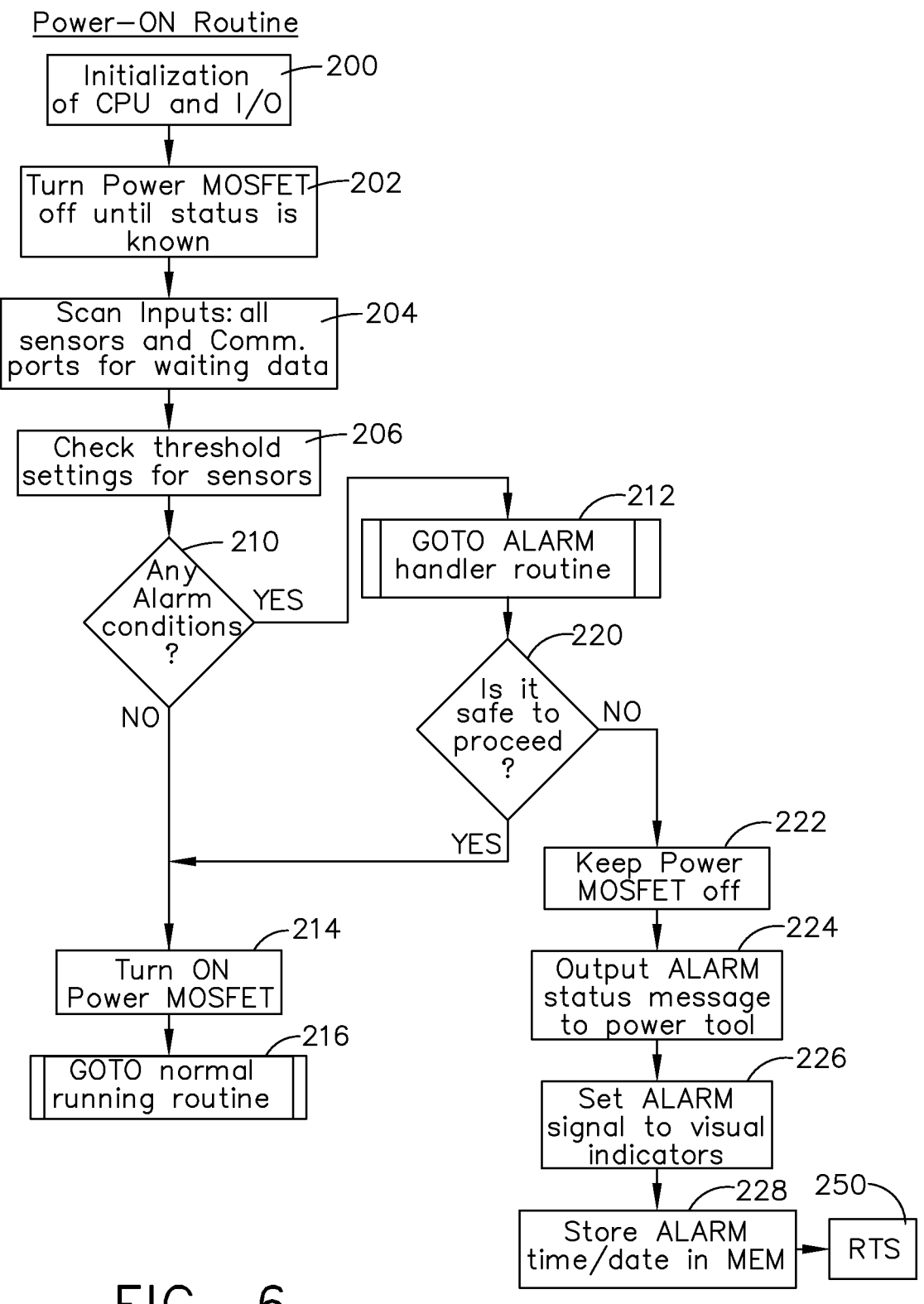

Power—ON Routine

Initialization of CPU and I/O — 200

Turn Power MOSFET off until status is known — 202

Scan Inputs: all sensors and Comm. ports for waiting data — 204

Check threshold settings for sensors — 206

Any Alarm conditions ? — 210

YES

GOTO ALARM handler routine — 212

Is it safe to proceed ? — 220

NO

Keep Power MOSFET off — 222

Output ALARM status message to power tool — 224

Set ALARM signal to visual indicators — 226

Store ALARM time/date in MEM — 228

RTS — 250

YES

NO

Turn ON Power MOSFET — 214

GOTO normal running routine — 216

FIG. 6

Normal Running Routine

BATTERY ADAPTER FOR POWER TOOLS

CROSS-REFERENCE TO RELATED APPLICATIONS

The present application claims priority to provisional patent application Ser. No. 63/351,865, titled "BATTERY ADAPTER FOR POWER TOOLS," filed on Jun. 14, 2022.

TECHNICAL FIELD

The technology disclosed herein relates generally to battery adapters and is particularly directed to battery adapters of the type which allow an off-brand battery to be utilized by a power tool, such as a fastener driving tool. Embodiments are specifically disclosed as battery adapters for fastener driving tools having a temperature sensor, a current sensor, a voltage sensor, and a plurality of LEDs, that provide operational data about the battery that can be used to automatically disable or electrically disconnect the battery in the event of a pre-set temperature or current threshold being exceeded, a low battery voltage threshold occurring, and also to visually display the battery's power level status to a user.

The battery adapter has a first side (or face) that physically and electrically connects to the power tool. A second, opposite side of the battery adapter physically and electrically connects to an external off-brand battery pack. The battery adapter is configured to provide electrical current from the external off-brand battery pack into the tool. The use of this type of battery adapter will allow an external power tool to be energized by an otherwise incompatible external battery pack. Note that, in this description, the battery pack is often described as being an "off-brand battery." In other words, the battery pack and the power tool are typically unable to be used together because they are of different brands, and thus, the battery is "off-brand" compared to the power tool.

The battery adapter includes a switching transistor, such as a power MOSFET, that is configured to operate normally, while continuously monitoring the temperature of the external off-brand battery pack. If the external off-brand battery pack reaches or exceeds a certain temperature range threshold, then the battery adapter is configured to electrically disconnect the external off-brand battery pack from sourcing electrical current.

The battery adapter has a current shunt that is configured to monitor the amplitude of current flow. The battery adapter is configured to electrically disconnect the external off-brand battery pack if the tool's current usage is greater than the rated output of the external off-brand battery pack, and also allows predetermined temporary 'overcurrent' conditions to exist, without disconnecting the current from the battery, so long as the overcurrent condition only exists for less than a predetermined time interval. The current control circuit provides a predetermined set of maximum allowable current ranges to exist for a set of corresponding predetermined time intervals, before disconnecting the battery current.

The battery adapter includes certain safety features that are usually not found on previous conventional battery adapters that have been sold for use with power tools. Some of the safety features disclosed herein include a reverse current detection circuit, an overcurrent vs. time detection circuit, and a 'remote' battery temperature monitoring circuit, in which the battery adapter has the ability to disconnect the battery pack from continuing to energize the power tool in the event that one of these safety conditions is violated.

STATEMENT REGARDING FEDERALLY SPONSORED RESEARCH OR DEVELOPMENT

None.

BACKGROUND

External batteries are commonly used in power tools, such as fastener driving tools. The batteries provide ample power and ease of use for typical cordless tool operations. Typically, each tool manufacturer sells its own brand of battery for use exclusively with its tools. For example, DeWalt™ tools work only with DeWalt batteries, and Makita™ tools work only with Makita batteries.

A common problem is that a many users have batteries from one manufacturer (i.e., DeWalt) but also have tools from other manufacturers, such as Senco. Not only are the electrical connections and physical shapes different between different battery manufacturers, but also are the safety requirements needed to safely use each battery.

SUMMARY

Accordingly, it is an advantage to provide a battery adapter for a power tool that is configured to use an off-brand battery, while monitoring battery temperature so that the off-brand battery can be electrically disconnected if a certain temperature range threshold has been reached or exceeded.

It is another advantage to provide a battery adapter for a power tool that is configured to use an off-brand battery, while monitoring current levels, so that the off-brand battery can be electrically disconnected if the battery adapter and the off-brand battery are connected to a charging station.

It is yet another advantage to provide a battery adapter for a power tool that is configured to use an off-brand battery, while monitoring the off-brand battery's power level, so that the adapter can visually display an approximate battery charge level.

It is still another advantage to provide a battery adapter for a power tool that is configured to use an off-brand battery, while monitoring the magnitude of the current being output by the off-brand battery, and if the current exceeds an 'overcurrent' threshold value, to also monitor the time duration of that 'overcurrent' status. If the 'overcurrent' status persists for longer than a predetermined time interval, then the system controller of the battery adapter will disconnect the power current pathway between the off-brand battery and the power tool. Moreover, there can be multiple thresholds of allowable 'overcurrent' magnitudes, each with its own maximum duration of time persistence before the system controller will disconnect the power current pathway.

Additional advantages and other novel features will be set forth in part in the description that follows and in part will become apparent to those skilled in the art upon examination of the following or may be learned with the practice of the technology disclosed herein.

To achieve the foregoing and other advantages, and in accordance with one aspect, a battery adapter is provided, which comprises: (a) a housing having a first side and a second, opposite side; (b) an electronic control circuit, including: a computer processing circuit, a memory circuit including instructions executable by the processing circuit, an input/output interface circuit, a current shunt, a current sensing circuit, and a power switching semiconductor that switches a power current pathway; (c) the housing first side physically and electrically mounts to an external power tool; (d) the housing second side physically and electrically mates with an external battery pack, in which the external power tool and the external battery pack are incompatible; wherein: (e) the battery adapter is operable to provide electrical current flowing from the external battery pack to the external power tool, thereby electrically powering the external power tool; (f) the current sensing circuit is operable to receive a voltage signal from the current shunt, and if the voltage signal exhibits a correct polarity and permissible magnitude, the power switching semiconductor is operable to allow current to flow from the external battery pack to the external power tool, using the power current pathway; and (g) if the voltage signal from the current shunt exhibits an incorrect polarity, then the power switching semiconductor is operable to disconnect the power current pathway.

In accordance with another aspect, a battery adapter is provided, which comprises: (a) a housing having a first side and a second, opposite side; (b) an electronic control circuit, including: a computer processing circuit, a memory circuit including instructions executable by the processing circuit, an input/output interface circuit, a current shunt, a current sensing circuit, and a power switching semiconductor that switches a power current pathway; (c) the housing first side physically and electrically mounts to an external power tool; (d) the housing second side physically and electrically mates with an external battery pack, in which the external power tool and the external battery pack are incompatible; wherein: (e) the battery adapter provides electrical current flowing from the external battery pack to the external power tool, thereby electrically powering the external power tool; (f) the current sensing circuit receives a voltage signal from the current shunt, and if the voltage signal exhibits a predetermined overcurrent magnitude for less than a predetermined permissible time interval, the power switching semiconductor is operable to allow current to flow from the external battery pack to the external power tool, using the power current pathway; and (g) if the voltage signal from the current shunt exhibits an overcurrent magnitude that continues for a greater time duration than the predetermined permissible time interval, the power switching semiconductor is operable to disconnect the power current pathway.

In accordance with yet another aspect, a battery adapter is provided, which comprises: (a) a housing having a first side and a second, opposite side; (b) an electronic control circuit, including: a computer processing circuit, a memory circuit including instructions executable by the processing circuit, an input/output interface circuit, and a power switching semiconductor; (c) the housing first side physically and electrically mounts to an external power tool; and (d) the housing second side physically and electrically mates with an external battery pack, in which the external power tool and the external battery pack are incompatible; (e) a remote temperature sensing circuit that remotely senses an electrical characteristic of a component that is on-board the external battery pack; wherein: (f) the battery adapter provides electrical current flowing from the external battery pack to the external power tool, thereby electrically powering the external power tool; and (g) the power switching semiconductor is operable to disconnect the current flowing from the external battery pack if a predetermined temperature threshold value is exceeded, as determined by the remote temperature sensing circuit.

In accordance with still another aspect, a battery adapter is provided, which comprises: (a) a housing having a first side and a second, opposite side; (b) an electronic control circuit, including: a computer processing circuit, a memory circuit including instructions executable by the processing circuit, an input/output interface circuit, a voltage sensing circuit, a power current pathway, and a plurality of colored LEDs (light emitting diodes) that exhibit at least two different colors; (c) a battery state switch; (d) the housing first side is operable to physically and electrically mount to an external power tool; (e) the housing second side is operable to physically and electrically mate with an external battery pack, in which the external power tool and the external battery pack are incompatible; wherein: (f) the battery adapter directs current flowing from the external battery pack to the tool using the power current pathway, thereby electrically powering the tool; (g) the voltage sensing circuit is connected to the power current pathway, and thereby detects a voltage magnitude that is output by the external battery pack; (h) the voltage sensing circuit is further connected to the input/output interface circuit; (i) at least one of the input/output interface circuit and the computer processing circuit includes an analog-to-digital converter (ADC) that generates a digital signal for analysis by the processing circuit; (j) if the battery state switch is actuated, then the plurality of colored LEDs energize to visually display a state of the external battery pack's energy level; and (k) the processing circuit determines which of the plurality of colored LEDs should be illuminated, based upon the value of the digital signal, and generates at least one output signal that controls the plurality of colored LEDs.

Still other advantages will become apparent to those skilled in this art from the following description and drawings wherein there is described and shown a preferred embodiment in one of the best modes contemplated for carrying out the technology. As will be realized, the technology disclosed herein is capable of other different embodiments, and its several details are capable of modification in various, obvious aspects all without departing from its principles. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the technology disclosed herein, and together with the description and claims serve to explain the principles of the technology. In the drawings:

FIG. 6 is a flow chart showing some of the important logic operations of a "power-on routine" of the battery adapter of FIG. 1.

DETAILED DESCRIPTION

Figure 1:
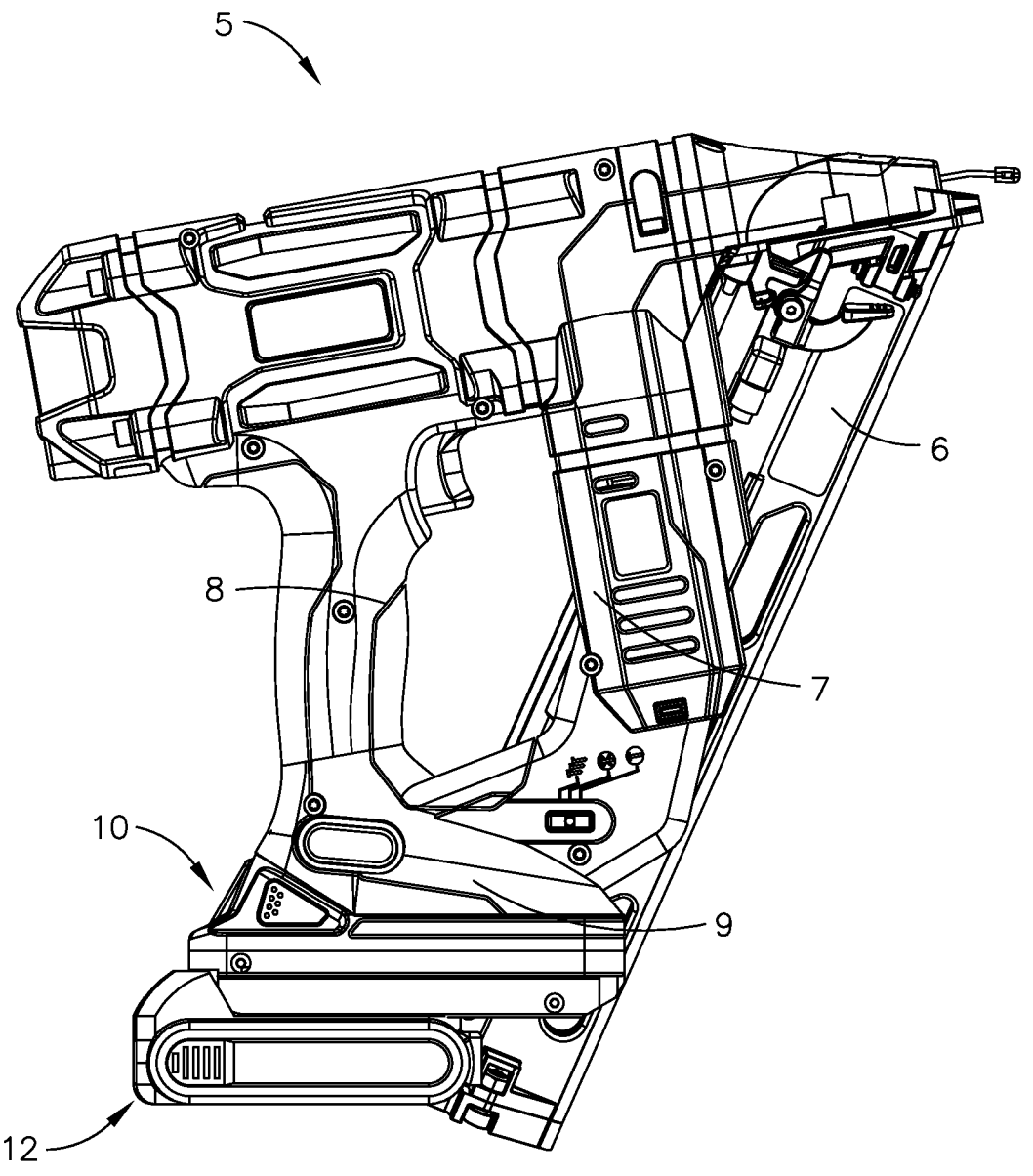
FIG. 1 is a right side elevational view of a battery adapter mated to a fastener driving tool on one side of the adapter, and an off-brand battery on the other side of the adapter, as constructed according to the principles of the technology disclosed herein.

Reference will now be made in detail to the present preferred embodiment, an example of which is illustrated in the accompanying drawings, wherein like numerals indicate the same elements throughout the views.

It is to be understood that the technology disclosed herein is not limited in its application to the details of construction and the arrangement of components set forth in the following description or illustrated in the drawings. The technology disclosed herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," or "mounted," and variations thereof herein are used broadly and encompass direct and indirect connections, couplings, or mountings. In addition, the terms "connected" or "coupled" and variations thereof are not restricted to physical or mechanical connections or couplings. Furthermore, the terms "communicating with" or "in communications with" refer to two different physical or virtual elements that somehow pass signals or information between each other, whether that transfer of signals or information is direct or whether there are additional physical or virtual elements therebetween that are also involved in that passing of signals or information. Moreover, the term "in communication with" can also refer to a mechanical, hydraulic, or pneumatic system in which one end (a "first end") of the "communication" may be the "cause" of a certain impetus to occur (such as a mechanical movement, or a hydraulic or pneumatic change of state) and the other end (a "second end") of the "communication" may receive the "effect" of that movement/change of state, whether there are intermediate components between the "first end" and the "second end," or not. If a product has moving parts that rely on magnetic fields, or somehow detects a change in a magnetic field, or if data is passed from one electronic device to another by use of a magnetic field, then one could refer to those situations as items that are "in magnetic communication with" each other, in which one end of the "communication" may induce a magnetic field, and the other end may receive that magnetic field, and be acted on (or otherwise affected) by that magnetic field.

The terms "first" or "second" preceding an element name, e.g., first inlet, second inlet, etc., are used for identification purposes to distinguish between similar or related elements, results or concepts, and are not intended to necessarily imply order, nor are the terms "first" or "second" intended to preclude the inclusion of additional similar or related elements, results or concepts, unless otherwise indicated.

In addition, it should be understood that embodiments disclosed herein include both hardware and electronic components or modules that, for purposes of discussion, may be illustrated and described as if the majority of the components were implemented solely in hardware.

However, one of ordinary skill in the art, and based on a reading of this detailed description, would recognize that, in at least one embodiment, the electronic based aspects of the technology disclosed herein may be implemented in software. As such, it should be noted that a plurality of hardware and software-based devices, as well as a plurality of different structural components may be utilized to implement the technology disclosed herein. Furthermore, if software is utilized, then the processing circuit that executes such software can be of a general purpose computer, while fulfilling all the functions that otherwise might be executed by a special purpose computer that could be designed for specifically implementing this technology.

It will be understood that the term "circuit" as used herein can represent an actual electronic circuit, such as an integrated circuit chip (or a portion thereof), or it can represent a function that is performed by a processing circuit, such as a microprocessor or an ASIC that includes a logic state machine or another form of processing element (including a sequential processing circuit). A specific type of circuit could be an analog circuit or a digital circuit of some type, although such a circuit possibly could be implemented in software by a logic state machine or a sequential processor. In other words, if a processing circuit is used to perform a desired function used in the technology disclosed herein (such as a demodulation function), then there might not be a specific "circuit" that could be called a "demodulation circuit;" however, there would be a demodulation "function" that is performed by the software. All of these possibilities are contemplated by the inventors, and are within the principles of the technology when discussing a "circuit."

In this technical disclosure, the word "battery" and the phrase "battery pack" will generally be used interchangeably. When dealing with actual battery pack designs, design engineers usually refer to an individual battery cell as a "battery," and a grouping of such battery cells (either connected in series or in parallel, or a combination of both types of connections) as a "battery pack." In this document, the inventors will sometimes use the phrase "battery pack," which of course has a fairly specific meaning—i.e., more than one battery cell. However, it is well known that most consumers refer to a power tool's source of energy as the "battery," even though everyone in this technical field knows that its correct terminology is "battery pack." Therefore, in this written description, the word "battery" usually refers to a "battery pack." If an individual battery cell is specifically being discussed herein, then the term "battery cell" will be used.

Referring now to FIG. 1, a SENCO® fastener driving tool 5 (such as a FUSION Finisher Model No. F-15XP Nailer, for example) is shown in a right side elevational view. The power tool 5 includes a fastener magazine 6, a motor housing portion 7, a handle portion with trigger 8, and a battery mounting portion 9. Typically, a Senco branded battery is mounted on the battery mounting portion 9, and then used to power the motor housed inside the motor housing portion 7. FIG. 1, however, shows a battery adapter mounted to the battery mounting portion 9. An off-brand battery 12 (such as a DeWalt® battery Model No. DCB240, DC182, or DCB203, for example) is mounted on the battery adapter 10.

On a first side (or upper portion) 20 (see FIG. 4), the batter adapter 10 is sized and shaped to fit into the battery mounting portion 9, in the same manner as a typical Senco branded battery. On a second side (or lower portion) 30, the battery adapter 10 is sized and shaped to receive an off-brand battery 12, such as a DeWalt battery, and will be discussed in further detail below. In other words, in this illustrated embodiment, the first side 20 of the battery adapter 10 interfaces with a Senco tool, and the second side 30 of the battery adapter interfaces with a DeWalt battery.

Figure 2:
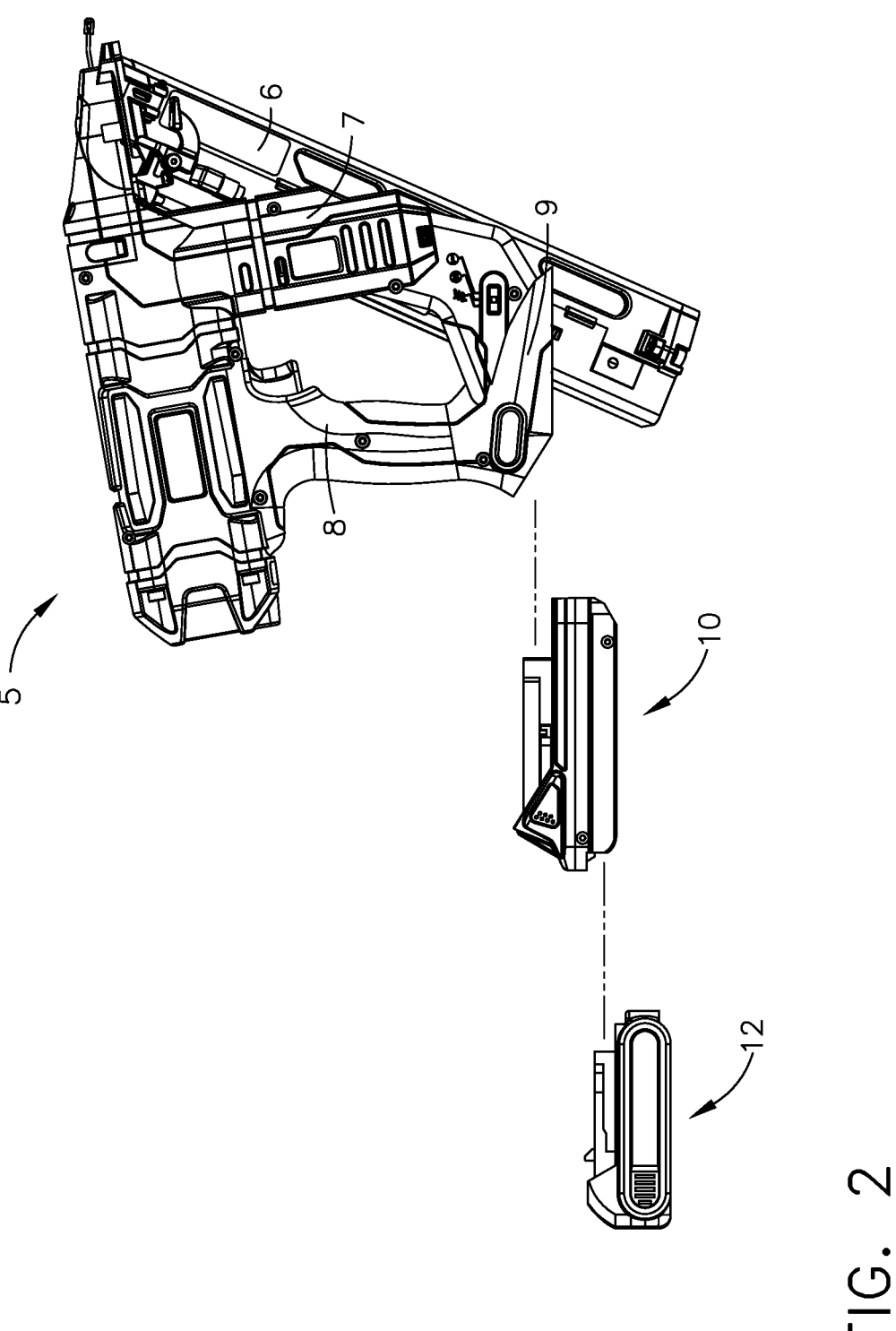
FIG. 2 is a right side exploded view of the battery adapter assembly of FIG. 1 showing the battery adapter removed from the tool, and the off-brand battery removed from the battery adapter.

Referring now to FIG. 2, a right side partially exploded view shows the battery adapter 10 dismounted from the power tool 5, and the off-brand battery 12 dismounted from the battery adapter. The battery adapter 10 can first be mounted to the power tool 5 at the battery mounting portion 9, and then the off-brand battery 12 can be mounted to the battery adapter. Alternatively, the off-brand battery 12 could be mounted to the battery adapter 10 first, and then the combination of the off-brand battery and the battery adapter could be mounted to the power tool 5 at the battery mounting portion 9.

Figure 3:
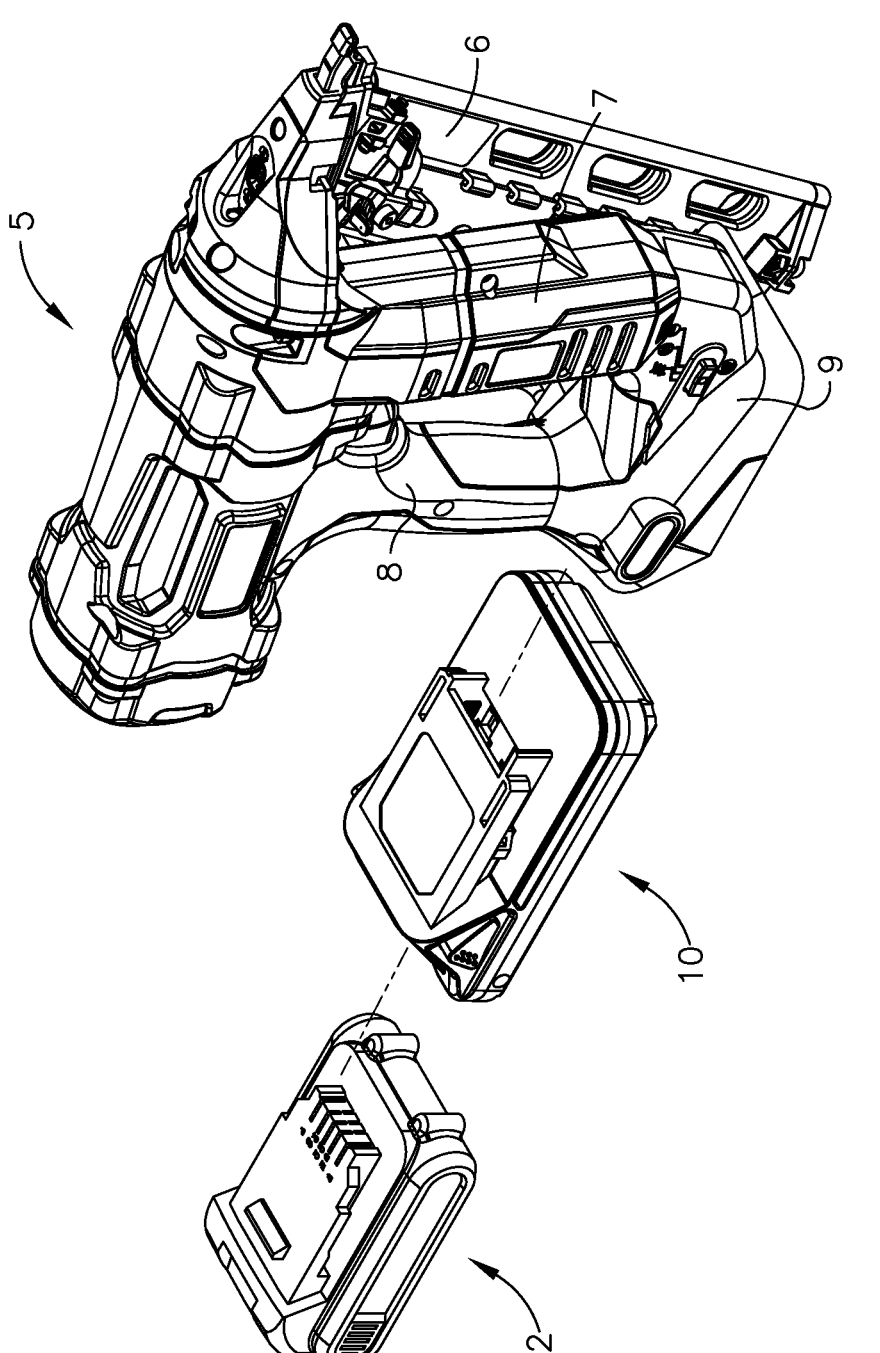
FIG. 3 is a right perspective view of the exploded view of FIG. 2.

Referring now to FIG. 3, a perspective view of FIG. 2 is illustrated. As noted above, the off-brand battery 12 and the battery adapter 10 can be mounted to the power tool and then the off-brand battery 12 may be used to power the tool's electrical system (including an electric motor) so the tool 5 can operate. The tool 5 typically drives fasteners such as nails or staples into a substrate. The fasteners are stored in the magazine 6, and sequentially driven via the fastener driver of the tool 5. The power tool 5 uses the electric motor to power a lifter to move a driver into a "ready" position. The driver is released to drive a fastener into a substrate (using gas pressure, in the form of a gas spring), and then the lift sequence begins again.

The Senco tool depicted in FIGS. 1-3 is a FUSION® tool, which uses pressurized gas to propel the driver to drive fasteners. This Senco FUSION tool has a pressurized storage chamber that stores the pressurized gas (inside its main housing at reference numeral 15), and the lifter must move the driver against this gas pressure during a lift sequence. This is accomplished by conducting electrical current from the battery into the motor, which operates the lifter. As noted above, the battery adapter 10 facilitates electrical current flow from the off-brand battery 12 and into the power tool 5 (i.e., to the motor and the tool's other electronic circuits).

It should be noted that each manufacturer's battery has a different electrical connector and a different physical connection. Without a battery adapter, a DeWalt battery could not be used in a Senco tool, and vice versa, for example. In other words, a user cannot simply plug in any manufacturer's battery into any power tool. The usefulness of the battery adapter becomes clear to an owner who has one or more DeWalt batteries but wants to use them in a Senco tool.

Figure 4:
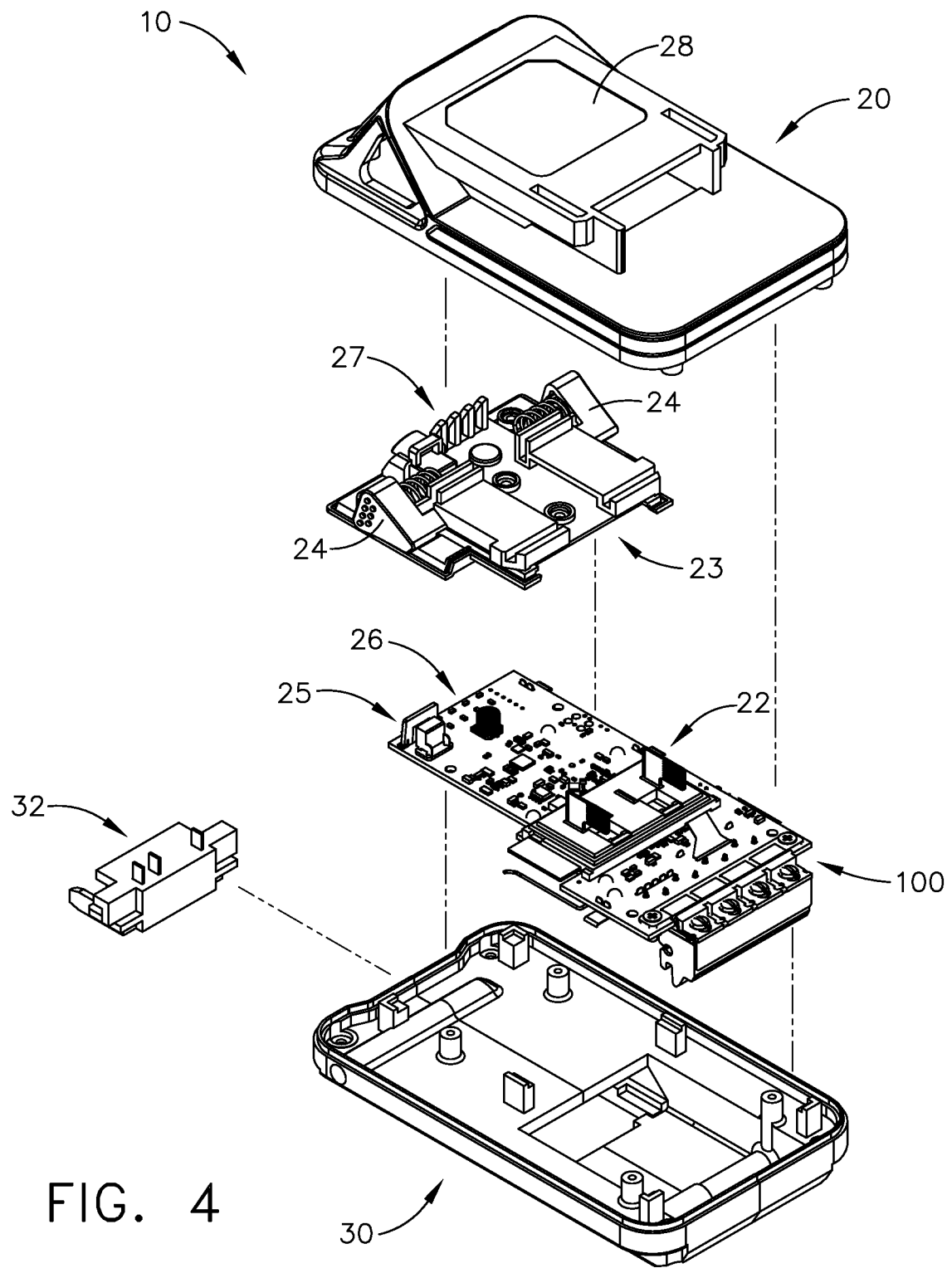
FIG. 4 is an exploded view of the battery adapter of FIG. 1.

Referring now to FIG. 4, an exploded view of the battery adapter 10 is shown. The upper portion 20 exhibits an upper surface 28. This upper surface 28 seats directly against the battery mounting portion 9 of the power tool 5.

A printed circuit board 100 (also sometimes referred to herein as the "adapter electronics," or "PCB") containing the electronics components for the battery adapter 10 includes electrical connections 22 to the power tool, a pushbutton 25 (also sometimes referred to herein as a "battery state switch" or "PB1"), and a plurality of LEDs 26 ("light emitting diodes").

An interior cover 23 covers a portion of the PCB 100 that includes the button and the plurality of LEDs 26. LED light pipes 27 on the interior cover 23 mount directly over the plurality of LEDs 26. A pair of manual latches 24 allow the battery adapter 10 to be electronically disconnected and dismounted from the power tool 5.

When a user presses the button 25 (assuming the off-brand battery 12 is mounted on the battery adapter 10), the LEDs 26 light up to display how much energy is left in the battery. The visible light signals emitted by the LEDs 26 are enhanced by the LED light pipes 27. The LEDs 26 are sometimes referred to as the "gas gauge," because they display how much "gas" (i.e., energy) is left in the off-brand battery 12. It is preferred that the LEDs 26 remain illuminated for only a relatively short time interval, such as for 3 seconds, or for 5 seconds. After that time interval has run, the LEDs 26 should be de-energized, to save battery energy.

In a preferred embodiment, the LEDs 26 include two green LEDs, one yellow LED, and one red LED. When the PB1 25 is pressed, five different indicated battery states are possible. In a first state, all four LEDs 26 light up indicating that the off-brand battery 12 is fully charged; in other words, two green, one yellow, and one red LED are illuminated. In a second state, only three of the LEDs 26 light up indicating that the off-brand battery 12 is at about 75% charge; in other words, one green, one yellow, and one red LED are illuminated. In a third state, only two LEDs 26 light up indicating that the off-brand battery 12 is at about 50% charge; in this state only the yellow and red LEDs are illuminated. In a fourth state, only the single red LED 26 lights up indicating that the off-brand battery 12 is at LOW power (at approximately 25% charge). In a fifth state, the one red LED 26 flashes on and off indicating that the off-brand battery 12 requires re-charging.

Another contemplated configuration could use three-color LEDs 26 to display the energy status of the off-brand battery 12. If all the LEDs 26 flash or illuminate green, for example, that means the power status is fully charged. If all the LEDs 26 flash or illuminate yellow, for example, that means the power status is low. If all the LEDs 26 flash or illuminate red, for example, that means the power status is nill, and the off-brand battery 12 needs to be recharged. It is contemplated that the three colors could be any three colors that an LED can display, and in any order, depending on how a battery adapter designer chooses to indicate the battery's charge status to a user.

It is also contemplated that the LEDs 26 could instead be a single color, and the battery status is indicated by showing how many LEDs are lit (or not lit). For example, four lit LEDs would mean "fully charged," two or three lit LEDs would mean progressively "lower power," and one or no lit LED would mean "virtually no power, time to recharge," for example.

Note that, the pushbutton switch (PB1) at 25 is to be manually actuated by the human user of the power tool, to be able to visually see the present charge state of the battery 12. When the pushbutton ("battery state") switch 25 is actuated, in a preferred mode of operation, the LEDs 26 will illuminate for a short time interval, such as for three seconds or for five seconds, as determined by the design engineer of the power tool's electronics. It is preferred to keep the LEDs unlit most of the time, since otherwise, they would be a constant power drain on the battery.

An electrical connection to the off-brand battery 32 is attached to the PCB 100 opposite the side that the electrical connections to the power tool 22 are on. The lower portion 30 is securely attached to the upper portion 20 and covers the PCB 100, the interior cover 27, and the electrical connection to the off-brand battery 32.

Figure 5:
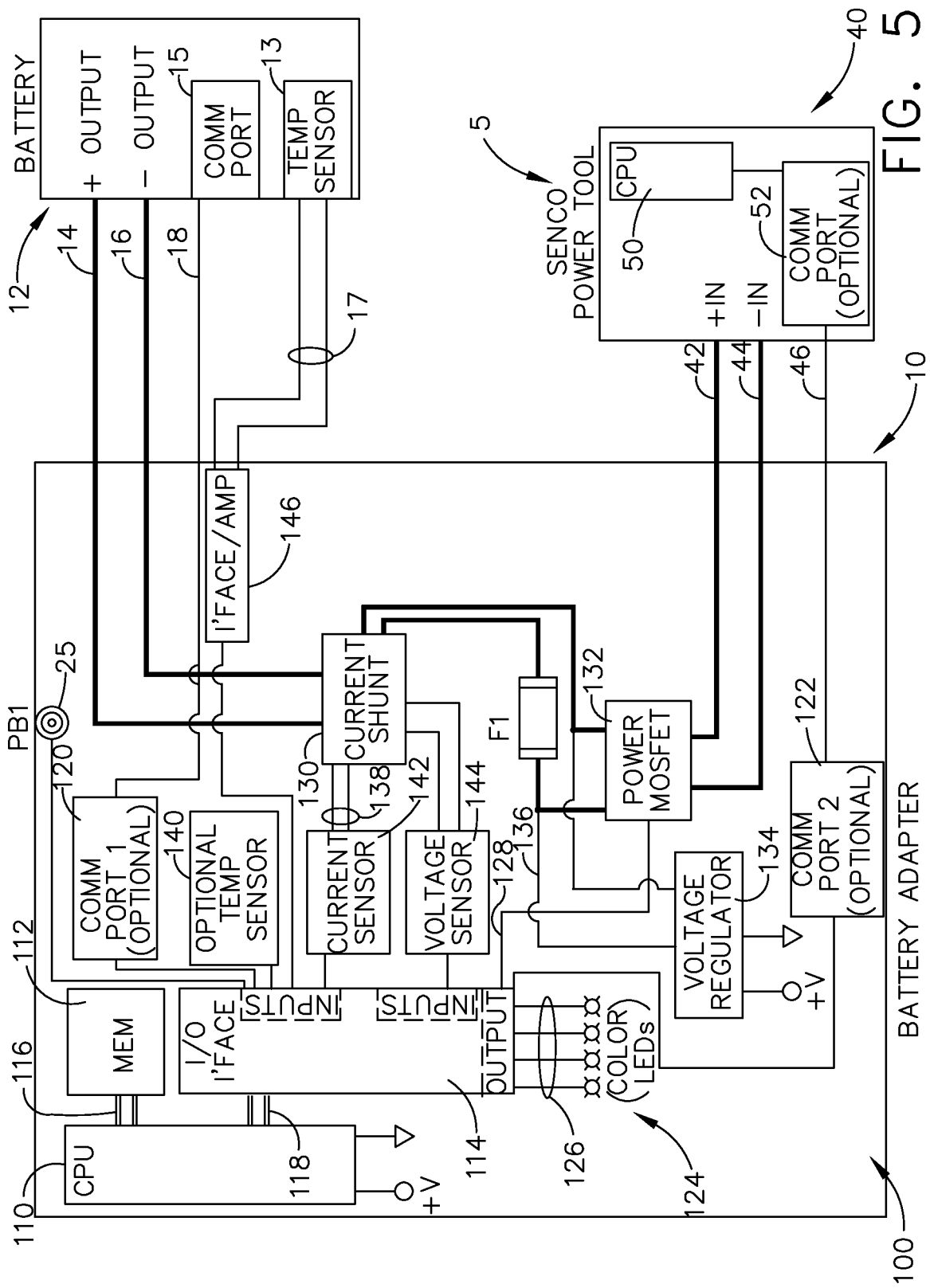
FIG. 5 is a block diagram showing some of the major electronic and electrical components for the battery adapter of FIG. 1.

Referring now to FIG. 5, some of the major electronic and electrical components of the battery adapter 10, an off-brand battery 12, and a Senco power tool 5 are shown in a block diagram. The Senco power tool 5 includes a CPU 50 (a "central processing unit") also sometimes referred to herein as a microprocessor. The Senco power tool 5 also optionally includes a power tool communication port 52 (or "comm port"). The optional comm port 52 includes a serial data lead 46 for communication with an external device, such as the battery adapter 10, for example. The Senco power tool 5 has a power tool "+" input lead 42 and a power tool "−" input lead 44 that connects electrically to the battery adapter 10, for example. The CPU 50, the optional comm port 52, the power tool "+" input terminal lead (at 42), and the power tool "−" input terminal lead (at 44) are collectively referred to herein as "Senco power tool electronics" 40.

The off-brand battery 12 includes a battery temperature sensor 13 (or "temp sensor"), a battery communications port 15 (or "comm port"), a battery "+" output lead 14, a battery "−" output lead 16, a battery serial data lead 18, and a plurality of battery temperature sensor output leads 17. The comm port 15 is optionally used for communication with an external device via the battery serial data lead 18, such as the battery adapter 10, for example. Various types of data could be transferred from the battery, including important operating status information, such as battery cell current, battery cell temperature, battery cell voltage levels, etc. The battery "+" output lead 14 and the battery "−" output lead 16 provide electrical power to an external device, such as a power tool, for example. The temperature sensor 13 provides temperature information via the battery temperature sensor output leads 17 to an external device, such as the battery adapter 10, for example.

In many instances, the battery temperature sensor is a relatively inexpensive thermistor, which has a variable resistance characteristic that varies as its temperature varies. (The resistance value of a thermistor typically decreases as the thermistor's temperature increases.) The thermistor 13 has two leads at 17, as shown in FIG. 5. It will be understood that one of the leads of the thermistor 13 could be electrically connected (inside the battery pack 12) to either the "+ OUTPUT" terminal (at lead 14) or to the "− OUTPUT" terminal (at lead 16), and in that circumstance, there would only need to be a single wire at 17 to interface to the I'FACE amplifier 146 that is in the battery adapter. This is a common configuration of many DeWalt batteries.

The battery adapter 10 includes the PCB 100, and the PCB includes a system controller 110 (also sometimes referred to herein as "CPU"). The controller 100 will typically include a microprocessor or microcomputer that acts as a processing circuit. At least one memory circuit 112 (also sometimes referred to herein as "MEM") will also typically be part of the controller, including Random Access Memory (RAM) and Read Only Memory (ROM) circuit elements. To store user-inputted information (if applicable), a non-volatile memory device would typically be included, such as EEPROM, NVRAM, or a Flash memory device. The CPU 110 and the MEM 112 communicate between each other over a memory and data bus 116. (Note: such buses can also include interrupt lines and memory select lines, if desired by the battery adapter designer.)

An I/O interface circuit 114 (also sometimes referred to herein (on the drawings) as an "I/O I'face") interfaces with several inputs and outputs on the PCB 100. The CPU 110 and the I/O interface circuit 114 communicate between each other over a memory and data bus 118. Inputs on the PCB 100 include: the PB1 25, an optional communications port #1 120 ("comm port #1"), an optional temperature sensor 140, a current sensor 142, a voltage sensor 144, a current shunt 130, and a battery temperature sensor interface/amplifier 146 (also sometimes referred to herein (on the drawings) as an "I'face/amp"). Outputs included on the PCB 100 are: a power MOSFET 132, an optional communications port #2 122 ("comm port #2"), and color LEDs (light emitting diodes) 124. (Note that LEDs 124 on FIG. 5 are the same components as LEDs 26 on FIG. 4.) Of course, other circuits and components are contemplated for the PCB 100, depending on the desires of the designer, and such other circuits include a fuse F1 (or fusible link), and a voltage regulator 134.

The battery comm port 15 can be configured to communicate with the optional comm port #1 over the battery serial data lead 18. The battery temperature sensor can be configured to communicate with the I'face/amp 146 over the plurality of battery temperature sensor output leads 17. The current shunt 130 and the current sensor 142 include a plurality of leads 138 between them; in this instance the current shunt includes at least one low-resistance resistor(s) that create(s) a relatively low-differential voltage signal to the current sensor 142. The current shunt resistor is in series with the high-current pathway that begins at the + OUTPUT lead at 14 and continues through the fuse F1 and power MOSFET 132 to the +IN lead at 42, or that begins at the − OUTPUT lead at 16 and continues through the power MOSFET 132 to the − IN lead at 44.

The I/O interface circuit 114 includes output control leads 126 to the color LEDs 124, and an output control lead 128 to the power MOSFET 132. The optional comm port #2 122 can communicate with the optional comm port 52 over the serial data lead 46.

In the illustrated embodiment, the fuse F1 is placed in the "+" battery power lead 136 upstream to the voltage regulator 134.

Reverse Current Disconnect

One purpose of the current shunt 130 is to prevent the off-brand battery 12 from being charged while attached to the battery adapter 10. This could occur if a user placed the battery adapter 10, with the off-brand battery 12 attached, on a Senco-brand battery charger. Due to manufacturing differences between batteries, it is preferred that the off-brand battery 12 be recharged using its own specific battery charger. For example, if the off-brand battery is a DeWalt™ battery, then the off-brand battery should be charged by a DeWalt™ battery charger.

However, if the battery adapter 10 with an attached off-brand battery 12 is placed on a Senco-brand battery charger, a reverse current flow may occur. The current shunt 130 is configured to detect this reverse current flow and send a signal to the I/O I'face 114, which then goes to the CPU 50. The CPU 50 is programmed to electrically disconnect the battery adapter 10 in the event of a reverse current detection.

In other words, the current sensing circuit 142, using a voltage signal (at 138) produced by the current shunt 130, will determine if the present current running through the power current pathway 14 and 16 has the correct polarity and a permissible magnitude, and if so, the power switching semiconductor (the MOSFET 132) is configured (under the control of the CPU 110) to allow current to continue flowing from the external battery pack 12 to the power tool 5, through (using) the power current pathway 14 and 16, and including the fuse F1, and the continuing power current pathway at 42 and 44. On the other hand, if the present current running through the power current pathway 14 and 16 does not have the correct polarity, then the voltage signal (at 138) produced by the current shunt 130, will detect that incorrect polarity, and (again, under the control of the CPU 110) the power switching semiconductor is configured to disconnect the power current pathway. This would typically be accomplished merely by turning off the semiconductor 132 (the MOSFET). It will be understood that the power MOSFET 132 could be constructed of a single transistor that 'opens' or 'closes' only one of the power current pathways, or it could be constructed of a pair of transistors that 'open' or 'close' both of the power current pathways.

It will be further understood that the electrical currents and 'signals' running through the various power current pathways and voltage or current sensing circuits in the circuits of FIG. 5 are direct current (DC) in nature, and the characterization of "polarity" essentially refers to the direction of the current flow. A more complex concept of polarity would typically only be needed if an optional type of battery pack included an AC generator (or alternator) type of device, to create an alternating current (AC) output, for powering a tool that included an AC motor, for example. If that type of battery pack were to be designed for fastener driving tools, then the circuit illustrated in FIG. 5 could still be used for the purposes described herein, with only minor changes. For one thing, the overcurrent detection scheme would likely be somewhat slower acting, since the magnitude of an AC signal is continuously varying all the time, even when conditions are nominal, and therefore, the determination that an overcurrent existed would possibly need to wait until the waveform (perhaps a sine wave or a square wave) moved away from the zero axis before noticing an unusually large magnitude.

In the above embodiment in which the current sensing circuit 142 is required to detect whether or not a reverse current is occurring, then the current sensor 138 must have the ability to detect both positive and negative voltage amplitudes. In such a design, a standard differential amplifier circuit would suffice, so long as it was connected to both a positive voltage supply and a negative voltage supply, and its operational amplifier was able to output both positive and negative voltage signals. Further, the input/output interface circuit 114 would also need to have the ability to convert both positive and negative voltage magnitudes into a digital signal value. In that manner, the system controller (the CPU 110) would be able to discern when an improper polarity current flow is passing through the current shunt 130.

Temperature Disconnect

Typical power tool battery packs include a temperature sensor, such as temp sensor 13, in the off-brand battery 12. However, each manufacturer's tool is typically pre-configured to receive information from a manufacturer-branded battery in order to shut the tool down in the event of a high-temperature alert.

The battery adapter 10 includes the fuse F1 and the power MOSFET 132, as well as the I'face/amp 146 to detect a high temperature event. Preferably, the power MOSFET 132 is configured to alert at temperatures around 150±5° C. for at least 300 ms. Of course, the power MOSFET can be configured to alert at almost any temperature range as determined by the system designer.

In an optional mode of operation, the battery's temperature sensor 13 may be pre-configured to transmit temperature alerts (as digital signals) over the plurality of battery temperature sensor output leads 17. In this optional configuration, the I'face/amp 146 receives any temperature alerts transmitted by the temp sensor 13. The I'face/amp 146 sends these temperature alerts to the I/O I'face 114, which then is sent to the CPU 50. The CPU 50 is configured to electrically disconnect the off-brand battery 12 in the event of a high temperature alert.

In a more conventional arrangement, the battery temperature sensor 13 is a more passive component, such as a thermistor, that exhibits an electrical characteristic that varies as its temperature varies. In the case of a thermistor, its resistance value will vary in the opposite direction with respect to its temperature. This varying resistance can be measured remotely, as a voltage signal that is directed to the I'FACE/AMP 146. In such a configuration, the interface amplifier 146 is preferably a differential amplifier.

Referring now to FIG. 6, a logic flow chart is provided to show some of the important logic operations used by the system controller for a power-on routine. At a logic function 200, an initialization of the CPU and I/O interface is started. Next, at a logic function 202, the power MOSFET is turned off until a status is known. Next, at a logic function 204, the CPU initiates an inputs scan, and all of the sensors and (optional) communication ports are scanned for data. Then, at a logic function 206, the CPU checks the threshold settings for the sensors, used for various alarm detections.

The routine then arrives at a logic decision 210, in which the sensors are queried for any alarm conditions. If no alarm conditions are detected, then the routine goes to a logic function 214, in which the power MOSFET is turned on. Then, at a logic function 216, the CPU returns to its normal running routine (see FIGS. 7A-7B).

Figure 8:
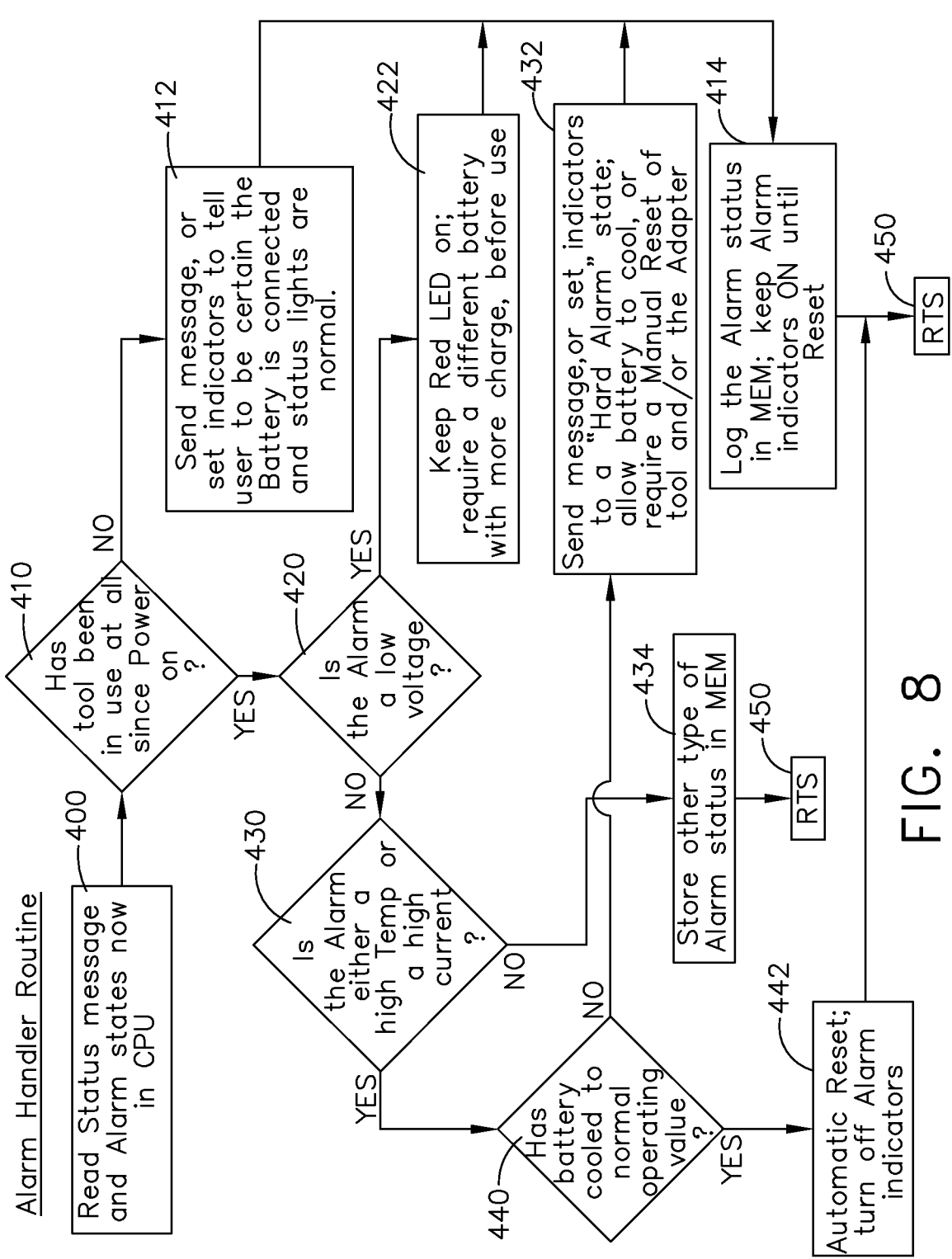
FIG. 8 is a flow chart showing some of the important logic operations of an "alarm handler routine" of the battery adapter of FIG. 1.

However, if YES at logic function 210, an alarm condition is detected at logic function 210, then at a logic function 212 the CPU goes to an alarm handler routine (see FIG. 8). Once the alarm handler routine is completed, the power-on routine continues with a logic function 220, which queries if it is safe to proceed. If the answer is YES, then the routine flows to the logic function 214 discussed above. Or, if the answer was NO, then the routine continues at a logic function 222, where the power MOSFET is kept off. Then, at a logic function 224, an output alarm status message is transmitted to the power tool. Next, at a logic function 226, the CPU instructs the alarm signal to energize the visual indicators (either on the power tool, or on the battery adapter, as per the preference of the system design engineer). Next, at a logic function 228, the time and date of the alarm condition is stored in memory. Finally, at a logic function 250, the power-on routine ends and returns from this subroutine.

Overcurrent or Undervoltage Disconnect

Figure 7A:
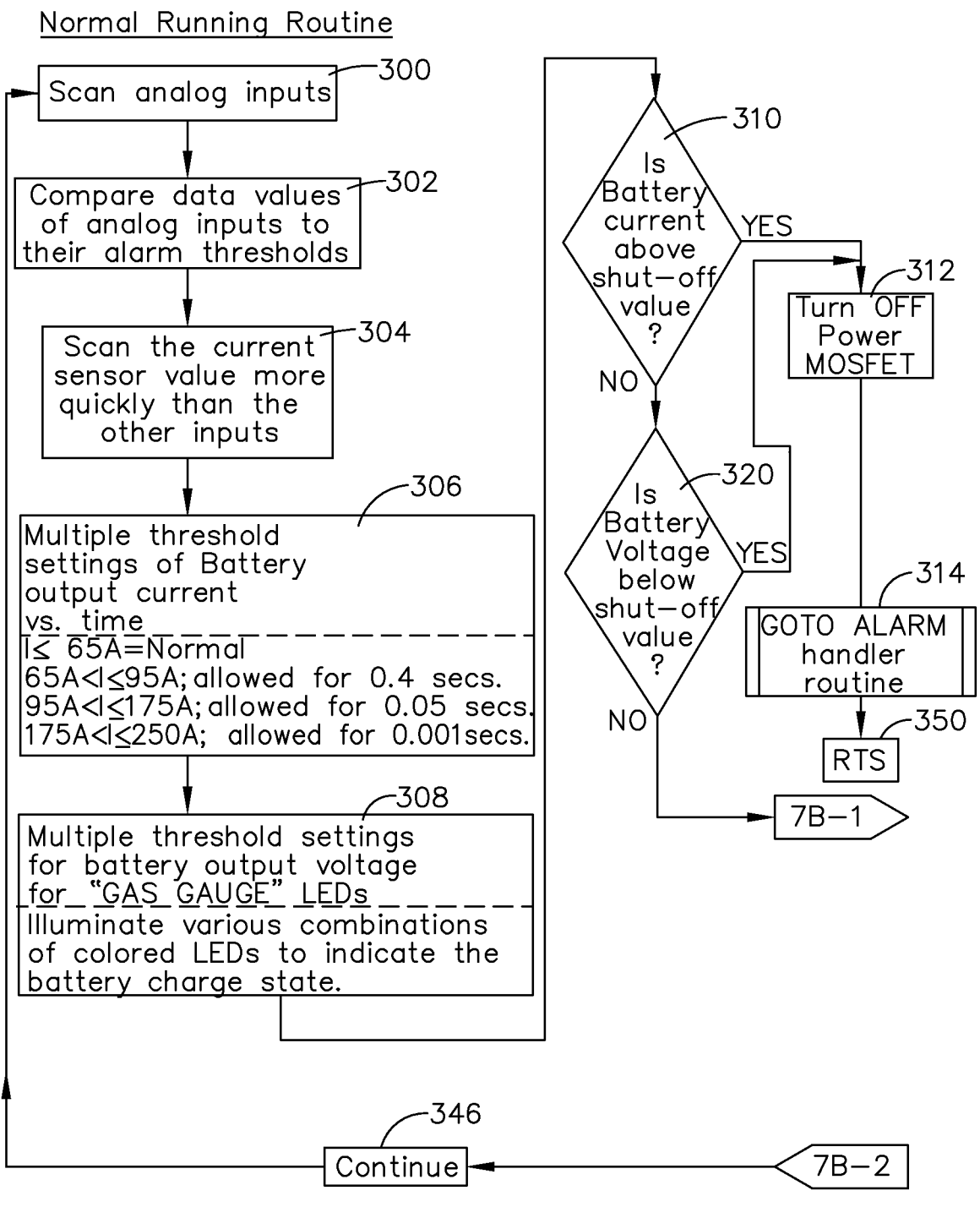
FIG. 7A is a first portion of a flow chart showing some of the important logic operations of a "normal running routine" of the battery adapter of FIG. 1.

Referring now to FIG. 7A, a flow chart is provided showing the first portion of a normal running routine. The routine begins at a logic function 300 by scanning the analog inputs. Next, at a logic function 302, the system controller compares the data values of the analog inputs to their alarm threshold values. Note that, according to a logic function 304, the current sensor data is scanned more quickly than the other inputs.

Next, at a logic function 306, the battery output current vs. time is determined against multiple threshold settings. As a preferred example, if I≤65 A (± about 5 Amperes), that condition is Normal; or if 65 A<I≤95 A (± about 5 Amperes), that condition is allowed to persist for 0.4 seconds; or if 95 A<I≤175 A (± about 5 Amperes), that condition is allowed to persist for 0.05 seconds; or if 175 A<I≤250 A (± about 5 Amperes), that condition is allowed to persist for 0.001 seconds. Of course, these thresholds can be modified depending on the specific safety requirements the designer is planning to use, and may well vary according to the type of battery pack that this alarm detection circuit is designed for.

Next, at a logic function 308, the battery output voltage ("V") is determined for use with the "gas gauge" 26, and which LEDs 124 to be illuminated are determined against multiple threshold settings. For a specific type lithium battery cell chemistry, a preferred set of ranges of battery state thresholds can be selected for use with an 18-volt battery pack containing five battery cells in series. For example, at a fully charged battery state (if V≥20.5 v D c), all four LEDs are to be energized—two Green LEDs, one Yellow LED, and one Red LED; at a next lower state of battery charge, only three LEDs are to be energized—one Green LED, one Yellow LED, and one Red LED (for a voltage range of, e.g., 19.8 VDC≤V<20.5 VDC); at a next lower state of battery charge, only two LEDs are to be energized— one Yellow LED, and one Red LED (for a voltage range of, e.g., 17.5 VDC≤V<19.8 VDC); at a next lower state of battery charge, only a single LED is to be energized—i.e., the one Red LED (for a voltage range of, e.g., 16.8 VDC<V≤17.5 VDC); and, at a next lower state of battery charge (this is the lowest battery charge state to be determined), only a single LED is to be energized—i.e., the one Red LED, flashing (for a voltage range of, e.g., V<16.8 VDC. It is contemplated that these thresholds can be modified depending on the specific requirements the system designer is planning to use, and again will likely vary for different battery packs.

It should be noted that the above threshold voltage levels for use in the "gas gauge" LEDs are typically determined at a "no load" condition; in other words, the power tool is not presently being used to, for example, drive a nail, or to turn a screw, or to rotate a saw. Therefore, the battery 12 is not being loaded to any significant extent. (It is of course providing power to the electronics of the battery adapter 100 and to the electronics of the power tool 5, but those electrical loads are insubstantial compared to a so-called "full load" condition.)

Then, at a logic decision 310, the system controller queries if the battery current is above a predetermined shut-off value. If YES, then the logic is directed to a logic function 312 in which the power MOSFET is turned off. Then, at a logic function 314, the logic is directed to the alarm handler routine (see FIG. 8). Once the alarm handler routine is performed, then, at a logic function 350, the normal running routine returns from this routine.

However, if the result at logic function 310 was NO, then another logic decision at 320 determines if the battery voltage is below a predetermined shut-off value. If YES, then the logic flows to the logic function 312 as discussed above. If NO, then the logic flows to the arrow "7B-1" and continues on FIG. 7B. As an example, if an 18-volt battery pack with five battery cells in series becomes discharged to such an extent that the overall output voltage, under load, falls all the way down to about 15 volts DC (or 14.4 volts DC, worst case), then the battery pack must be quickly disconnected, or there could be permanent damage to those battery cells. This 14.4 volt threshold essentially is a recommended 'turn off' limit for such 18-volt battery packs. Of course, other battery designs using a different number of battery cells and a different overall output voltage would have a numerically different mandatory 'turn off' voltage limit. Furthermore, if a partially depleted battery experiences a high inrush current, which can often occur when the motors in larger power tools turn on (e.g., for framing nailers, or automatic screwdriving tools), then it is generally preferred to allow the battery pack voltage to temporarily drop even further for a short time interval, without disconnecting that battery. For example, if an 18-volt batter pack is partially depleted, it may experience an inrush current of about 100 Amperes in the case of a relatively large power tool, and its voltage would be allowed to drop to about 10 volts for a maximum time duration of about 50 msec, without being disconnected. This is an exception to the minimum threshold voltage 'rule' of 14.4 volts, stated above.

The overall operation of the flow chart of FIG. 7A, regarding the function logic function 306 can be summarized using a somewhat different description. As discussed above, there are multiple threshold settings of permissible battery output 'overcurrent' magnitudes that can be tolerated for predetermined (relatively short) time intervals, without requiring the power transistor (the MOSFET) 132 to disconnect the battery current. This can also be described as having the current sensing circuit 142 receive a voltage signal (at 138) from the current shunt 130, and if the voltage signal exhibits a predetermined overcurrent magnitude for less than a predetermined permissible time interval, the power switching semiconductor (MOSFET 132) is configured to allow current to flow from the external battery pack 12 to the power tool 5, using the power current pathway (at 14, 16, 42, and 44). However, if the voltage signal from the current shunt exhibits an overcurrent magnitude that continues for a greater time duration than the appropriate predetermined permissible time interval, then the power switching semiconductor is configured to disconnect the power current pathway. In other words, the power transistor 132 will interrupt the current flowing between the pathways 14, 16 and 42, 44. Note that, by placing the MOSFET 132 just 'before' the power current is to be delivered to the power tool 5 (see FIG. 5), the battery adapter 100 would still remain powered by the battery pack 12, even though the MOSFET 132 interrupted the current to the tool 5. This allows the battery adapter electronics to be ready to continue sensing its inputs and controlling its outputs while waiting for the overcurrent situation to be resolved.

Continuing this alternative description, the condition of a predetermined overcurrent magnitude for less than a predetermined permissible time interval will preferably comprise at least two ranges of overcurrent magnitudes and permissible time intervals, such that: (a) a first overcurrent magnitude will have a first maximum current magnitude that is permitted to exist for a first maximum time interval before a determination is made to disconnect the power current pathway; (b) a second overcurrent magnitude will have a second maximum current magnitude that is permitted to exist for a second maximum time interval before a determination is made to disconnect the power current pathway; and (c) if the second maximum current magnitude is greater than the first maximum current magnitude, then the second maximum time interval is less than the first maximum time interval. This can be seen to be true from the description above, referring to the logic function 306 on FIG. 7A. Moreover, this paragraph states the general case: the greater the magnitude of the operating 'overcurrent' that can be temporarily tolerated by a given battery pack design, the shorter amount of time that this 'overcurrent' can be allowed to persist before damaging that battery. This principle is fairly well-known in the art.

Yet another description regarding the normal running routine of FIG. 7A is now provided. The processing circuit is configured: (a) to maintain a set of current and time threshold values in the memory circuit 112; (b) to periodically receive sampled current magnitude readings from the current shunt 130, using an analog-to-digital converter (ADC) that is part of the input/output interface circuit 114 (or the ADC could be on-board the processing circuit chip, itself); (c) to periodically analyze the received sampled current magnitude readings, and to determine if the most recent magnitude reading corresponds to one of the overcurrent magnitude threshold values (using logic function 306); and (d) if so, to determine a time duration for which the most recent magnitude reading has persisted, and then to make a final decision about disconnecting, or not disconnecting the power transistor 132. This final decision is performed by the processing circuit 110, as follows: (i) if the determined time duration is not greater than the time threshold value for the most recent magnitude reading, then to allow the power switching semiconductor 132 to remain in a current conducting state, which will not disconnect the power current pathway; or (ii) if the determined time duration is greater than the time threshold value for the most recent magnitude reading, then to command said power switching semiconductor to change to a current non-conducting state, which will disconnect the power current pathway between the battery pack 12 and the power tool 5.

Figure 7B:
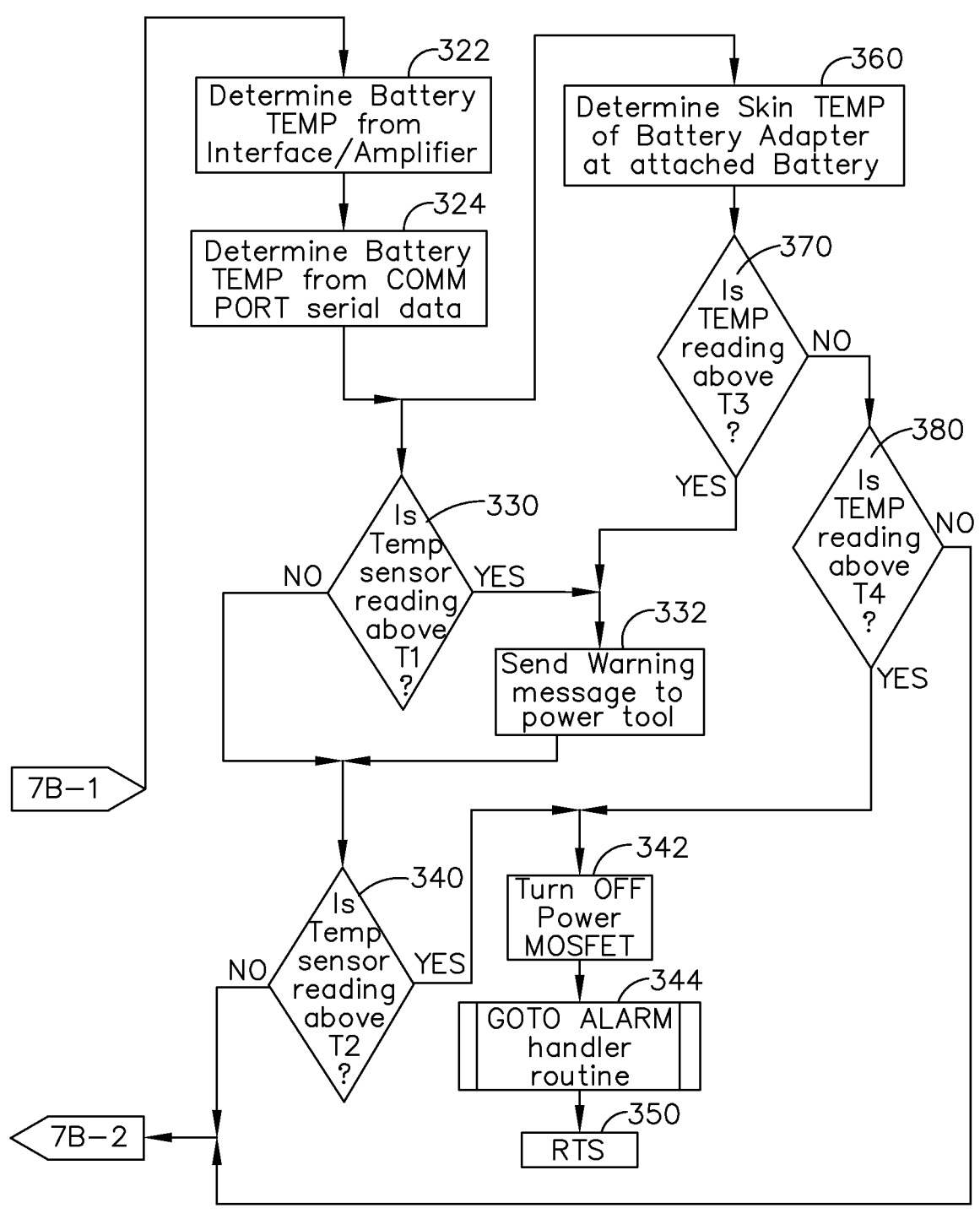
FIG. 7B is a second portion of the flow chart of FIG. 7A.

Referring now to FIG. 7B, a flow chart is provided showing a second portion of the normal running routine. At the arrow 7B-1, the logic continues to a logic function 322, in which the system controller determines the battery temperature from the I'face/amp 146. Then, at a logic function 324, the system controller determines the battery temperature from the comm port 15 serial data. (Logic function 324 depends on if the PCB 100 has the optional comm port #1 120 installed.)

Next, at a logic decision 330, the system controller determines if the temperature sensor reading is above a first temperature threshold value "T1." T1 is preferably at least 140° F. If the answer is YES, then at a logic function 332 a warning message can optionally be sent to the power tool. If the answer was NO, then at a logic decision 340, the system controller determines if the temperature sensor reading is above a second (higher) temperature "T2." T2 is preferably at least 160° F. If the answer is NO, then the logic flows to the arrow "7B-2" and continues on FIG. 7A. These threshold values T1 and T2 are set by the system designer. It should be noted that, since temperatures for most physical systems change rather slowly compared to many other phenomena (such as voltage or current in electrical circuits), it is recommended that the system controller not be hasty in deciding to turn off the power MOSFET 132 at logic decision 340 and logic function 342. In other words, prudent system design should require at least two or three consecutive 'high' readings coming from the temperature sensor (e.g., those readings at the A/D converter (the ADC), as it samples its inputs) before disconnecting the battery (by turning off the MOSFET 132). This recommended feature will also improve the noise immunity characteristic of this power tool system.

While the system controller is comparing the actual temperature to the T1 threshold at logic decision 330, it is also determining a skin temperature of the battery adapter at a physical location that is proximal to the attached off-brand battery, at a logic function 360. Then, at a logic decision 370, the system controller determines if the temperature sensor reading is above a third temperature threshold value "T3." As before, the threshold value of T3 is set by the system designer, and for example, T3 is preferably at least 100° F. If the result is YES, then the logic is directed to the logic decision 332, discussed above. However, if the result is NO, then the logic is directed to a logic decision 380, in which the system controller determines if the temperature sensor reading is above a fourth (higher) temperature "T4." The value of T4 is set by the system designer, and for example, T4 is preferably at least 120° F. Note that, in the design of this optional feature, the temperature sensing circuit includes a solid-state temperature sensor 140 that is positioned proximal to the side surface of the housing that faces the battery pack 12, so as to directly detect a temperature of that external battery pack.

It will be understood that the optional temperature sensor 140 would essentially be used only as a 'back-up plan', in case there is no actual temperature sensor 13 in the battery pack 12. Battery cells can heat up very quickly when under high-current discharge load conditions, and having an on-board temperature sensor inside the battery pack 12 is much more desirable than only having an optional temperature sensor 140 in the battery adapter 100.

If the result at logic function 380 was NO, then the logic is directed to arrow 7B-2 and continues on FIG. 7A. However, if the result at logic function 380 was YES (i.e., the temperature reading was 'high'), then the logic is directed to a logic function 342, and the system controller turns the power MOSFET off. And referring back to logic decision 340, if the result was YES (i.e., the temperature reading was 'high'), then the logic at a logic function 342 again will turn off the MOSFET. The logic then continues to at logic function 344 where the system controller goes to the alarm handler routine (see FIG. 8). Last, at a logic function 350, after the alarm handler routine has completed, the normal running routine returns from this routine.

At arrow 7B-2, the logic flows back to FIG. 7A at a logic function 346 where the normal running routine "continues." The logic returns to the "beginning" of the routine at the logic function 300. In other words, the normal running routine is a continuously running routine that vigorously checks the various safety thresholds associated with the battery adapter 10 and the off-brand battery 12.

Referring now to FIG. 8, a flow chart is provided showing the alarm handler routine. First, at a logic function 400, the system controller reads status messages and alarm states now in the CPU. Then, at a logic decision 410, the system controller determines if the power tool has been in use at all since powered on. If the answer is NO, then at a logic function 412 the system controller sends a message, or sets indicators, to tell the user to be certain that the battery is connected and the status lights are normal. Then, at a logic function 414, the system controller logs the alarm status in memory, and keeps the alarm indicators ON until the tool is reset. Last, at a logic function 450, the alarm handler routine ends and returns from this routine.

However, if the result at logic function 410 is YES, then at a logic decision 420, the system controller determines if the alarm is a low voltage alert. If the result is YES, then at a logic function 422, the system controller keeps the red LED on, which requires the user to change to a different off-brand battery with a sufficient state of charge, before using the power tool. The logic then flows to logic function 414 as discussed above.

If the result at logic function 420 is NO, then at a logic decision 430, the system controller determines if the alarm is either a high temperature or a high current alert. If the result is NO, then at a logic function 434 the system controller stores the other type of alarm status in memory. Then at a logic function 450, the alarm handler routine ends and returns from this routine.

If the result at logic function 430 is YES, then at a logic decision 440, the system controller determines if the battery has cooled to a normal operating value. If the result is NO, then at a logic function 432 the system controller sends a message, or sets indicators to a "Hard Alarm" state; which allows the battery to cool, or requires a manual reset of the power tool and/or the battery adapter. The logic then flows to a logic function 414 as discussed above.

If the result at logic function 440 is YES, then at a logic function 442, there is an automatic reset, which turns off the alarm indicators and allows the power tool to function normally. Then the logic continues to logic function 450, in which the alarm handler routine ends and returns from this routine.

Figure 9:
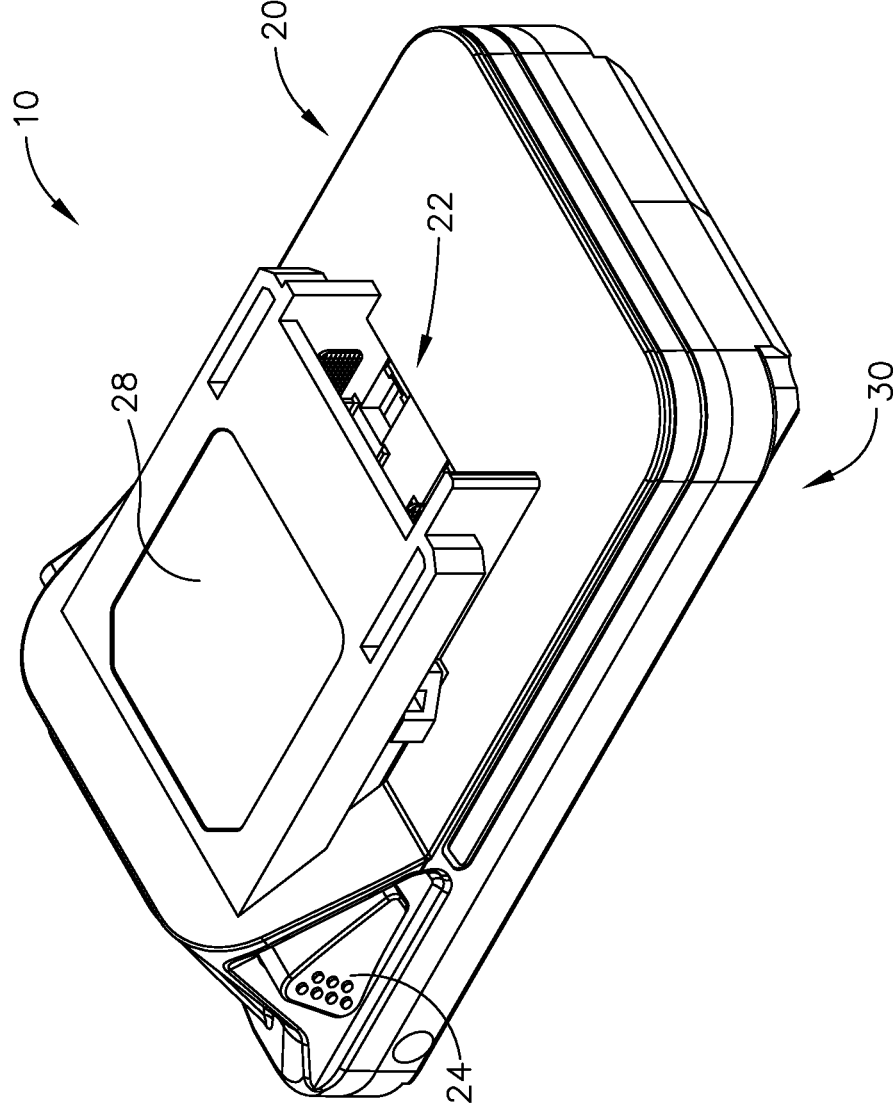
FIG. 9 is a front, top perspective view of the battery adapter of FIG. 1.

Referring now to FIG. 9, the battery adapter 10 is shown in a front top perspective view. The upper portion 20 and upper surface 28 slide on and secure to the battery mounting portion 9 when the battery adapter 10 is connected to the power tool 5. The electrical connections 22 to the tool will electrically connect to that tool 5 when the battery adapter 10 is mounted to the tool. The manual latch 24 can be depressed to enable a user to remove (dismount) the battery adapter 10 from the tool 5.

Figure 10:
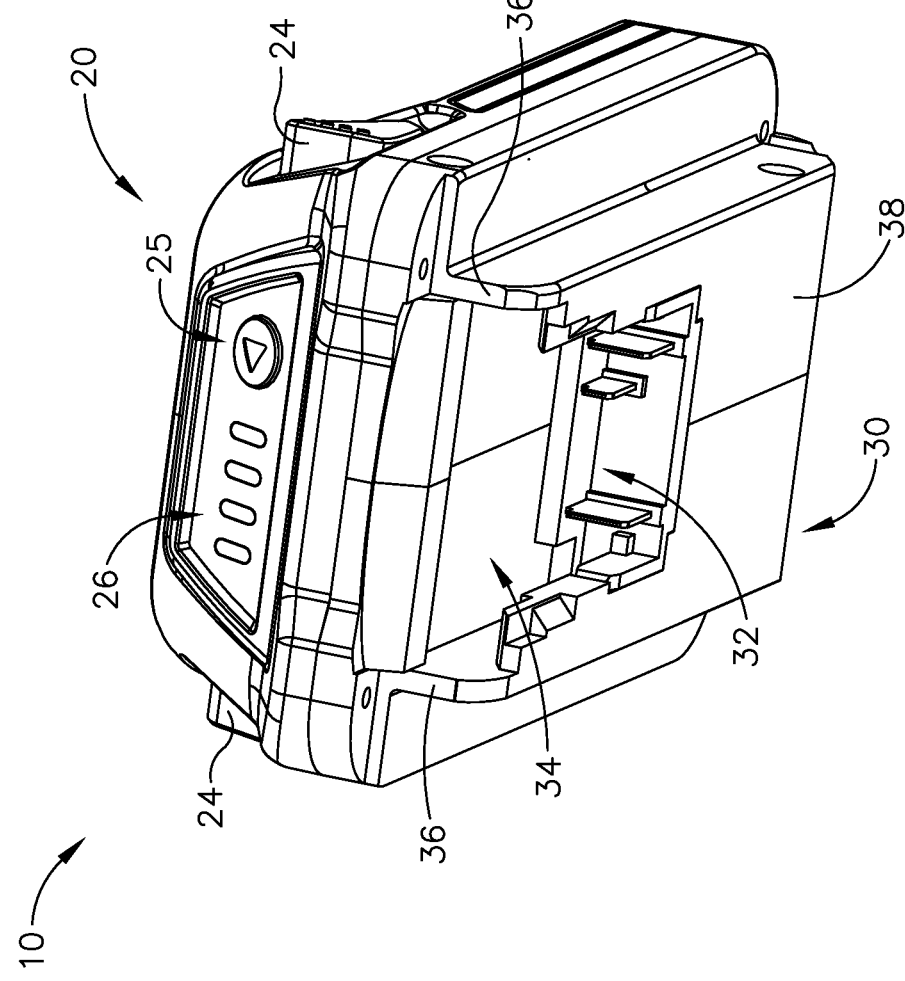
FIG. 10 is a rear, bottom perspective view of the battery adapter of FIG. 1.

Referring now to FIG. 10, the battery adapter 10 is shown in a rear bottom perspective view. The gas gauge 26 and the push button PB1 25 is shown. The lower portion 30 and a lower surface 38 interface with the off-brand battery 12 when connected together. The off-brand battery 12 slides between a set of guide rails 36 and into a recess portion 34, where it electrically connects with the electrical connection to the off-brand battery 32. To remove (dismount) the off-brand battery 12 from the battery adapter 10, one or more manual latches are depressed, in an action similar to the manual latch 24 on the battery adapter.

Figure 11:
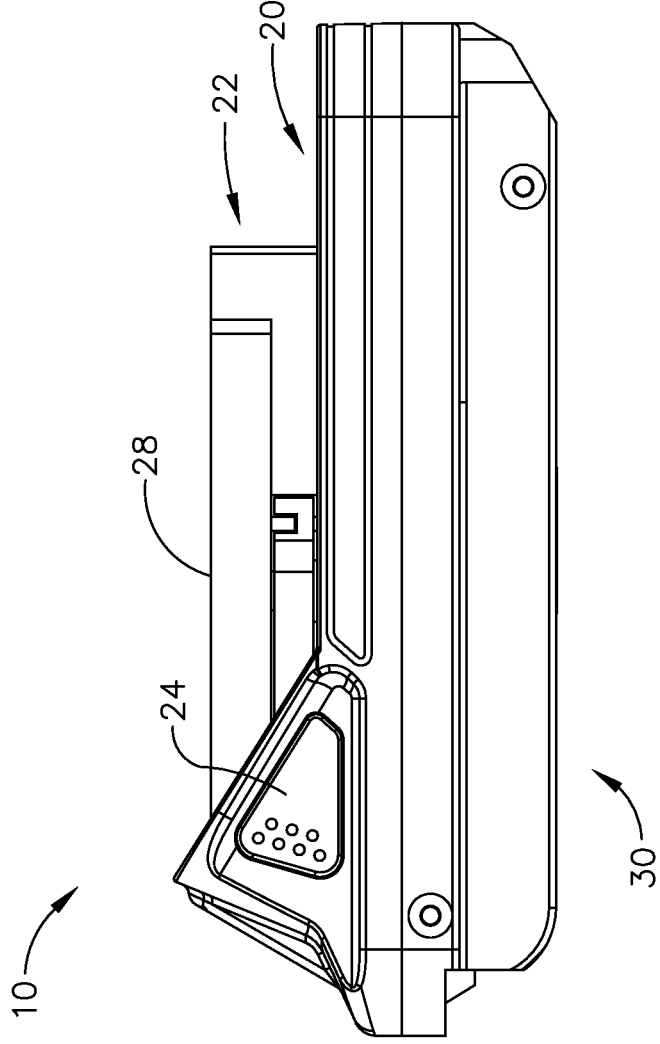
FIG. 11 is a right side elevational view of the battery adapter of FIG. 1.

Referring now to FIG. 11, the battery adapter 10 is shown in a right side elevational view. As discussed above, the upper portion 20 and the upper surface 28 mate to the battery mounting portion 9, and the electrical connections at 22 mate to the power tool and will electrically connect to the tool 5. The lower portion 30 interfaces with the off-brand battery 12.

Figure 12:
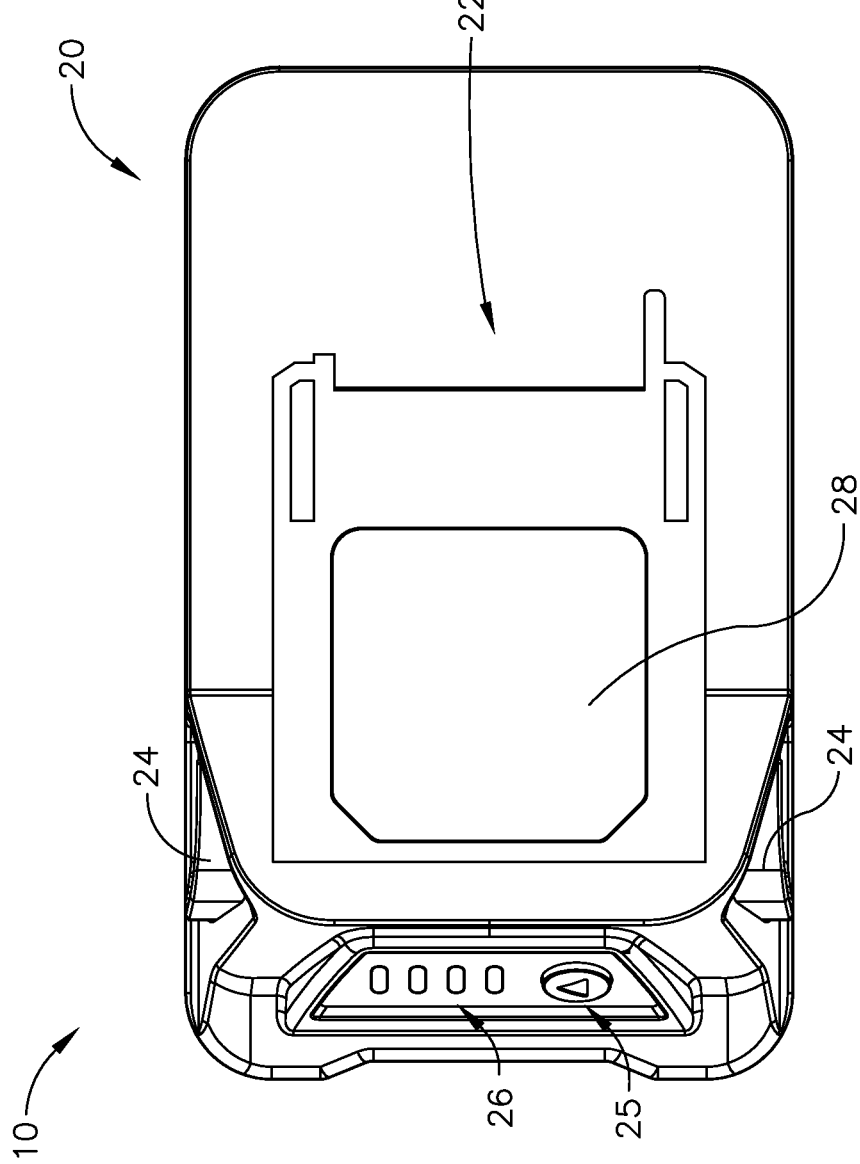
FIG. 12 is a top plan view of the battery adapter of FIG. 1.

Referring now to FIG. 12, the battery adapter 10 is illustrated in a top plan view. In this view, the gas gauge 26 and the PB1 25 are shown at the left end (in this view) of the battery adapter 10. In this position, the gas gauge 26 is easy to see during operation, since it sits directly beneath a user's hand gripping the handle portion 8 of the power tool 5. Of course, it is contemplated that the gas gauge 26 and the PB1 25 can be placed in other positions around the battery adapter 10, as per the desire of the system designer.

Figure 13:
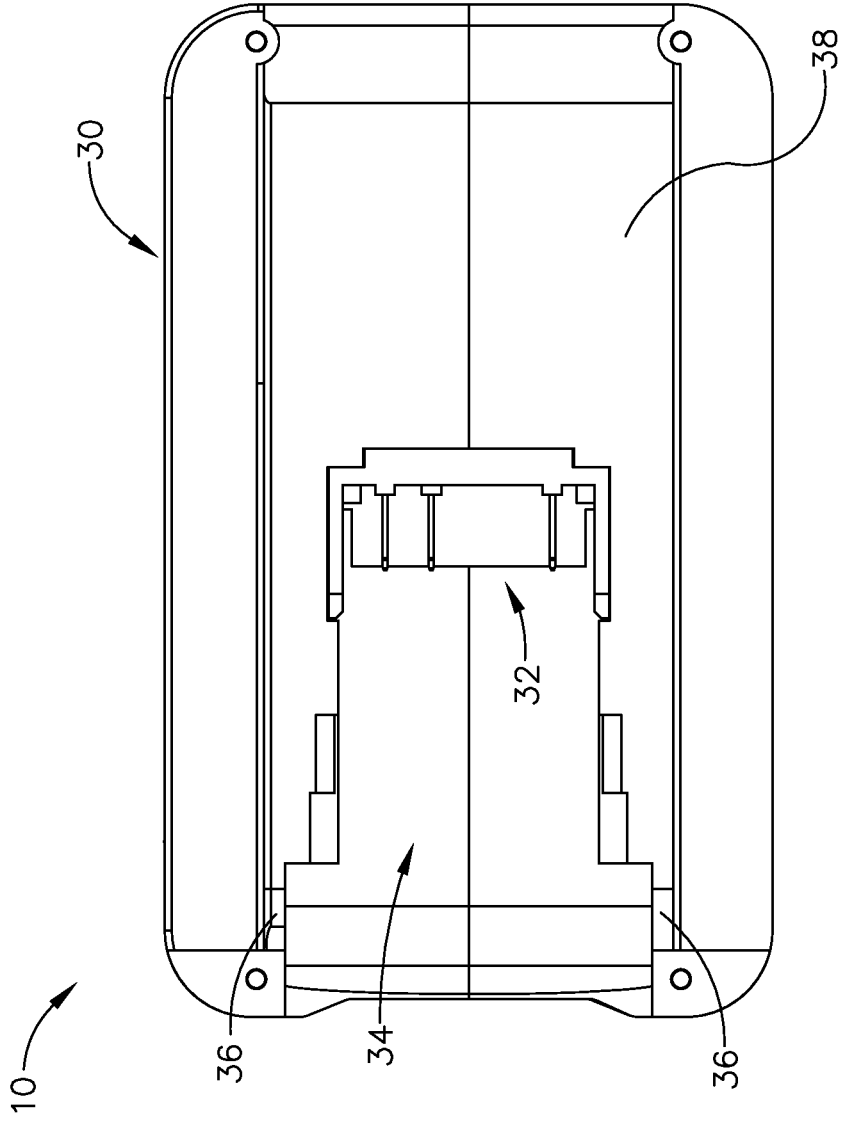
FIG. 13 is a bottom plan view of the battery adapter of FIG. 1.

Referring now to FIG. 13, the battery adapter 10 is illustrated in a bottom plan view. The off-brand battery 12 is attached (mounted) by sliding it onto the battery adapter 10 from the left (in this view) so that the off-brand battery electrically connects with the electrical connections to the battery 32.

Note that some of the embodiments illustrated herein do not have all of their components included on some of the figures herein, for purposes of clarity. To see examples of such outer housings and other components, especially for earlier designs, the reader is directed to other U.S. patents and applications owned by Senco. Similarly, information about "how" the electronic controller operates to control the functions of the power tool is found in other U.S. patents and applications owned by Senco. Moreover, other aspects of the present tool technology may have been present in earlier fastener driving tools sold by the Assignee, Kyocera Senco Industrial Tools, Inc., including information disclosed in previous U.S. patents and published applications. Examples of such publications are patent numbers U.S. Pat. Nos. 6,431,425; 5,927,585; 5,918,788; 5,732,870; 4,986,164; 4,679,719; 8,011,547, 8,267,296, 8,267,297, 8,011,441, 8,387,718, 8,286,722, 8,230,941, 8,602,282, 9,676,088, 10,478,954, 9,993,913, 10,549,412, 10,821,585 and 8,763,874; also published U.S. patent application No. 2020/0156228, published U.S. patent application No. 2021/0016424, published U.S. patent application No. 2020/0070330, and published U.S. patent application No. 2020/0122308. These documents are incorporated by reference herein, in their entirety.

It will be understood that the logical operations described in relation to the flow charts of FIGS. 6-8 can be implemented using sequential logic (such as by using microprocessor technology), or using a logic state machine, or perhaps by discrete logic; it even could be implemented using parallel processors. One preferred embodiment may use a microprocessor or microcontroller (e.g., microprocessor 110) to execute software instructions that are stored in memory cells within an ASIC. In fact, the entire microprocessor 110, along with RAM and executable ROM, may be contained within a single ASIC, in one mode of the technology disclosed herein. Of course, other types of circuitry could be used to implement these logical operations depicted in the drawings without departing from the principles of the technology disclosed herein. In any event, some type of processing circuit will be provided, whether it is based on a microprocessor, a microcomputer, a microcontroller, a logic state machine, by using discrete logic elements to accomplish these tasks, or perhaps by a type of computation device not yet invented; moreover, some type of memory circuit will be provided, whether it is based on typical RAM chips, EEROM chips (including Flash memory), by using discrete logic elements to store data and other operating information, or perhaps by a type of memory device not yet invented. In general, the memory circuit of a particular electronic product will contain instructions that are executable by the processing circuit of that same particular electronic product.

It will also be understood that the precise logical operations depicted in the flow charts of FIGS. 6-8, and discussed above, could be somewhat modified to perform similar, although perhaps not exact, functions without departing from the principles of the technology disclosed herein. The exact nature of some of the logic decisions and other commands in these flow charts are directed toward specific future models of battery adapters for fastener driving tools (those involving Senco nailers or screwdriving tools using DeWalt batteries, for example) and certainly similar, but somewhat different, functions or decisions would be taken for use with other models or brands of battery adapters (such as Milwaukee batteries) in many instances, with the overall inventive results being the same.

As used herein, the term "proximal" can have a meaning of closely positioning one physical object with a second physical object, such that the two objects are perhaps adjacent to one another, although it is not necessarily required that there be no third object positioned therebetween. In the technology disclosed herein, there may be instances in which a "male locating structure" is to be positioned "proximal" to a "female locating structure." In general, this could mean that the two male and female structures are to be physically abutting one another, or this could mean that they are "mated" to one another by way of a particular size and shape that essentially keeps one structure oriented in a predetermined direction and at an X-Y (e.g., horizontal and vertical) position with respect to one another, regardless as to whether the two male and female structures actually touch one another along a continuous surface. Or, two structures of any size and shape (whether male, female, or otherwise in shape) may be located somewhat near one another, regardless if they physically abut one another or not; such a relationship could still be termed "proximal." Or, two or more possible locations for a particular point can be specified in relation to a precise attribute of a physical object, such as being "near" or "at" the end of a stick; all of those possible near/at locations could be deemed "proximal" to the end of that stick. Moreover, the term "proximal" can also have a meaning that relates strictly to a single object, in which the single object may have two ends, and the "distal end" is the end that is positioned somewhat farther away from a subject point (or area) of reference, and the "proximal end" is the other end, which would be positioned somewhat closer to that same subject point (or area) of reference.

It will be understood that the various components that are described and/or illustrated herein can be fabricated in various ways, including in multiple parts or as a unitary part for each of these components, without departing from the principles of the technology disclosed herein. For example, a component that is included as a recited element of a claim hereinbelow may be fabricated as a unitary part; or that component may be fabricated as a combined structure of several individual parts that are assembled together. But that "multi-part component" will still fall within the scope of the claimed, recited element for infringement purposes of claim interpretation, even if it appears that the claimed, recited element is described and illustrated herein only as a unitary structure.

All documents cited in the Background and in the Detailed Description are, in relevant part, incorporated herein by reference; the citation of any document is not to be construed as an admission that it is prior art with respect to the technology disclosed herein.

The foregoing description of a preferred embodiment has been presented for purposes of illustration and description. It is not intended to be exhaustive or to limit the technology disclosed herein to the precise form disclosed, and the technology disclosed herein may be further modified within the spirit and scope of this disclosure. Any examples described or illustrated herein are intended as non-limiting examples, and many modifications or variations of the examples, or of the preferred embodiment(s), are possible in light of the above teachings, without departing from the spirit and scope of the technology disclosed herein. The embodiment(s) was chosen and described in order to illustrate the principles of the technology disclosed herein and its practical application to thereby enable one of ordinary skill in the art to utilize the technology disclosed herein in various embodiments and with various modifications as are suited to particular uses contemplated. This application is therefore intended to cover any variations, uses, or adaptations of the technology disclosed herein using its general principles. Further, this application is intended to cover such departures from the present disclosure as come within known or customary practice in the art to which this technology disclosed herein pertains and which fall within the limits of the appended claims.

What is claimed is:

1. A battery adapter, comprising:
   (a) a housing having a first side and a second side, opposite the first side;
   (b) an electronic control circuit, including: a computer processing circuit, a memory circuit including instructions executable by the computer processing circuit, an input/output interface circuit, a current shunt, a current sensing circuit, a power switching semiconductor that switches a power current pathway, a plurality of colored LEDs (light emitting diodes) that exhibit at least two different colors, and a plurality of light pipes that are proximally positioned and associated with the plurality of colored LEDs;
   (c) a battery state switch;
   (d) the first side is configured to physically and electrically mount to an external power tool of a first manufacturer;
   (e) the second side is configured to physically and electrically mate with an external battery pack of a second manufacturer, in which the external power tool and the external battery pack are incompatible;
   wherein:
   (f) the battery adapter is operable to provide electrical current flowing from the external battery pack to the external power tool, thereby electrically powering the external power tool;
   (g) the current sensing circuit is operable to receive a voltage signal from the current shunt, and if the voltage signal exhibits a correct polarity and permissible magnitude, the power switching semiconductor is operable to allow current to flow from the external battery pack to the external power tool, using the power current pathway
   (h) at least one of the input/output interface circuit and the computer processing circuit includes an analog-to-digital converter (ADC) that generates a digital signal for analysis by the computer processing circuit;
   (i) if the battery state switch is actuated, then the plurality of colored LEDs energize to visually display a state of the external battery pack's energy level; and
   (j) the computer processing circuit determines which of the plurality of colored LEDs should be illuminated, based upon a value of the digital signal, and generates at least one output signal that controls the plurality of colored LEDs; and
   (k) if the voltage signal from the current shunt exhibits an incorrect polarity, then the power switching semiconductor is operable to disconnect the power current pathway.

2. The battery adapter of claim 1, further comprising:
   (a) a manual latch to disconnect the battery adapter from the external power tool; and
   (b) at least one guide rail on the second side to guide the external battery pack for insertion and removal from the battery adapter.

3. The battery adapter of claim 1, wherein:
   (a) the current shunt comprises a resistor of a predetermined, substantially low resistance value;

(b) the current sensing circuit comprises a differential voltage amplifier that has an active range for detecting both positive and negative voltages; and (c) at least one of the input/output interface circuit and the computer processing circuit includes an analog-to-digital converter (ADC) that has an active range for detecting both positive and negative voltages.

4. The battery adapter of claim 1, further comprising:

a battery state switch;

a plurality of LEDs;

wherein:

if the battery state switch is activated, the plurality of LEDs temporarily energize to visually indicate the energy level of the external battery pack.

5. The battery adapter of claim 1, wherein:

the power switching semiconductor comprises at least one metal oxide semiconductor field effect transistor (MOSFET).

6. The battery adapter of claim 1, wherein:

if the voltage signal exhibits an incorrect polarity, then that is an indication that the battery adapter is being used to charge the external battery pack through the battery adapter, and therefore, the power switching semiconductor will disconnect the power current pathway.

7. A battery adapter, comprising:

(a) a housing having a first side and a second side, opposite the first side;

(b) an electronic control circuit, including: a computer processing circuit, a memory circuit including instructions executable by the computer processing circuit, an input/output interface circuit, a current shunt, a current sensing circuit, and a power switching semiconductor that switches a power current pathway;

(c) the first side is configured to physically and electrically mount to an external power tool of a first manufacturer;

(d) the second side is configured to physically and electrically mate with an external battery pack of a second manufacturer, in which the external power tool and the external battery pack are incompatible;

wherein:

(e) the battery adapter is operable to provide electrical current flowing from the external battery pack to the external power tool, thereby electrically powering the external power tool;

(f) the current sensing circuit is operable to receive a voltage signal from the current shunt, and if the voltage signal exhibits a correct polarity and permissible magnitude, the power switching semiconductor is operable to allow current to flow from the external battery pack to the external power tool, using the power current pathway (g) a fuse; and (h) if the voltage signal is determined to have a correct polarity the power switching semiconductor is configured to allow current to flow from the external battery pack to the external power tool and if the current shunt exhibits an incorrect polarity, then the power switching semiconductor is operable to disconnect the power current pathway.

*     *     *     *     *